(12) United States Patent
Hsieh

(10) Patent No.: US 11,665,881 B2
(45) Date of Patent: May 30, 2023

(54) MEMORY DEVICE WITH VERTICAL FIELD EFFECT TRANSISTOR AND METHOD FOR PREPARING THE SAME

(71) Applicant: NANYA TECHNOLOGY CORPORATION, New Taipei (TW)

(72) Inventor: Ming-Hung Hsieh, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 70 days.

(21) Appl. No.: 17/390,405

(22) Filed: Jul. 30, 2021

(65) Prior Publication Data

US 2023/0029551 A1  Feb. 2, 2023

(51) Int. Cl.
*H01L 29/78* (2006.01)
*H01L 29/10* (2006.01)

(52) U.S. Cl.
CPC ......... *H10B 12/30* (2023.02); *H01L 29/1033* (2013.01); *H01L 29/7827* (2013.01); *H10B 12/03* (2023.02); *H10B 12/485* (2023.02)

(58) Field of Classification Search
None
See application file for complete search history.

(56) References Cited

U.S. PATENT DOCUMENTS

| | | | |
|---|---|---|---|
| 11,348,928 B1* | 5/2022 | Fackenthal | H01L 27/1108 |
| 2003/0082875 A1* | 5/2003 | Lee | H01L 27/10867 |
| | | | 438/243 |
| 2020/0302993 A1 | 9/2020 | Tanaka et al. | |

FOREIGN PATENT DOCUMENTS

| | | |
|---|---|---|
| TW | I223439 | 11/2004 |
| TW | 201911538 A | 3/2019 |
| TW | 201912352 A | 4/2019 |
| TW | 202127673 A | 7/2021 |

* cited by examiner

*Primary Examiner* — Mohammad M Hoque
*Assistant Examiner* — Kevin Quinto
(74) *Attorney, Agent, or Firm* — Muncy, Geissler, Olds & Lowe, P.C.

(57) ABSTRACT

The present disclosure relates to a memory device with a vertical field effect transistor (VFET) and a method for preparing the memory device. The memory device includes a capacitor contact disposed in a first semiconductor substrate, and a channel structure disposed over a top surface of the first semiconductor substrate. The memory device also includes a first gate structure disposed on a first sidewall of the channel structure, and a second gate structure disposed on a second sidewall of the channel structure. The second sidewall of the channel structure is opposite to the first sidewall of the channel structure. The memory device further includes a bit line contact disposed over the channel structure. The channel structure is electrically connected to a capacitor and a bit line through the capacitor contact and the bit line contact.

17 Claims, 31 Drawing Sheets

MEMORY DEVICE WITH VERTICAL FIELD EFFECT TRANSISTOR AND METHOD FOR PREPARING THE SAME

TECHNICAL FIELD

The present disclosure relates to a memory device and a method for preparing the same, and more particularly, to a memory device with a vertical field effect transistor (VFET) and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device is provided. The memory device includes a capacitor contact disposed in a first semiconductor substrate, and a channel structure disposed over a top surface of the first semiconductor substrate. The memory device also includes a first gate structure disposed on a first sidewall of the channel structure, and a second gate structure disposed on a second sidewall of the channel structure. The second sidewall of the channel structure is opposite to the first sidewall of the channel structure. The memory device further includes a bit line contact disposed over the channel structure. The channel structure is electrically connected to a capacitor and a bit line through the capacitor contact and the bit line contact.

In an embodiment, the capacitor contact is in direct contact with a bottom surface of the channel structure, and the bit line contact is in direct contact with a top surface of the channel structure. In an embodiment, the channel structure is disposed between the bit line and the capacitor. In an embodiment, the memory device further includes a second semiconductor substrate bonded to a bottom surface of the first semiconductor substrate, wherein the capacitor is disposed in the second semiconductor substrate. In an embodiment, the first gate structure includes a first gate electrode and a first gate dielectric sandwiched between the first gate electrode and the channel structure, and the second gate structure includes a second gate electrode and a second gate dielectric sandwiched between the second gate electrode and the channel structure.

In an embodiment, the memory device further includes a first dielectric portion disposed over the top surface of the first semiconductor substrate and on a third sidewall of the channel structure, and a second dielectric portion disposed over the top surface of the first semiconductor substrate and on a fourth sidewall of the channel structure, wherein the third sidewall of the channel structure is opposite to the fourth sidewall of the channel structure. In an embodiment, the first gate structure and the second gate structure extend to cover opposite sidewalls of each of the first dielectric portion and the second dielectric portion.

In another embodiment of the present disclosure, a memory device is provided. The memory device includes a first capacitor contact and a second capacitor contact disposed in a semiconductor substrate, and a first channel structure and a second channel structure disposed over the semiconductor substrate and separated from each other. The first channel structure is electrically connected to a first capacitor through the first capacitor contact, and the second channel structure is electrically connected to a second capacitor through the second capacitor contact. The memory device also includes a first gate structure disposed on a first sidewall of the first channel structure and a first sidewall of the second channel structure, and a second gate structure disposed on a second sidewall of the first channel structure and a second sidewall of the second channel structure. The first sidewall of the first channel structure is opposite to the second sidewall of the first channel structure, and the first sidewall of the second channel structure is opposite to the second sidewall of the second channel structure. The memory device further includes a first bit line contact and a second bit line contact disposed over the first channel structure and the second channel structure, respectively. The first channel structure is electrically connected to a first bit line through the first bit line contact, and the second channel structure is electrically connected to a second bit line through the second bit line contact.

In an embodiment, the first capacitor contact is disposed between the first channel structure and the first capacitor, and the second capacitor contact is disposed between the second channel structure and the second capacitor. In an embodiment, the first channel structure is in direct contact with the first capacitor contact and the first bit line contact, and the second channel structure is in direct contact with the second capacitor contact and the second bit line contact. In an embodiment, the memory device further includes a first dielectric portion disposed between and in direct contact with the first channel structure and the second channel structure.

In an embodiment, the first dielectric portion is disposed between and in direct contact with the first gate structure and the second gate structure. In an embodiment, the first dielectric portion is separated from the semiconductor substrate. In an embodiment, the memory device further includes a second dielectric portion disposed between the first gate structure and the second gate structure, wherein the first channel structure is disposed between and in direct contact with the first dielectric portion and the second dielectric portion.

In yet another embodiment of the present disclosure, a method for preparing a memory device is provided. The method includes forming a capacitor contact in a first semiconductor substrate, and forming a first sacrificial structure and a second sacrificial structure over a top surface of the first semiconductor substrate and on opposite sides of the capacitor contact. The method also includes forming a first gate structure on a sidewall of the first sacrificial structure and a second gate structure on a sidewall of the second sacrificial structure facing the sidewall of the first sacrificial structure, and forming a dielectric strip between the first gate structure and the second gate structure. The method further includes replacing a first portion of the dielectric strip with a channel structure, forming a bit line contact over the channel structure, and forming a bit line over the bit line contact.

In an embodiment, the method further includes bonding a second semiconductor substrate to a bottom surface of the first semiconductor substrate, wherein a capacitor in the second semiconductor substrate is electrically connected to the channel structure through the capacitor contact. In an embodiment, the method further includes removing the first sacrificial structure and the second sacrificial structure after the channel structure is formed. In an embodiment, a second portion of the dielectric strip adjoins the channel structure.

In an embodiment, the step of forming the first gate structure and the second gate structure further includes forming a first gate electrode on the sidewall of the first sacrificial structure and a second gate electrode on the sidewall of the second sacrificial structure, and forming a first gate dielectric on a sidewall of the first gate electrode and a second gate dielectric on a sidewall of the second gate electrode, wherein the first gate dielectric and the second gate dielectric is physically connected by a connecting portion covering the capacitor contact. In an embodiment, the connecting portion is partially etched to expose the capacitor contact before the channel structure is formed.

Embodiments of a memory device and method for preparing the same are provided in the disclosure. In some embodiments, the memory device includes a channel structure disposed over a semiconductor substrate and covering a capacitor contact in the semiconductor substrate, and a bit line contact disposed over the channel structure. In some embodiments, the memory device also includes a first gate structure disposed on a first sidewall of the channel structure, and a second gate structure disposed on a second sidewall of the channel structure opposite to the first sidewall of the channel structure. The channel structure is electrically connected to a capacitor and a bit line through the capacitor contact and the bit line contact. Since the channel structure provides a vertical electrical connection between the capacitor and the bit line, the integration density of the memory device can be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
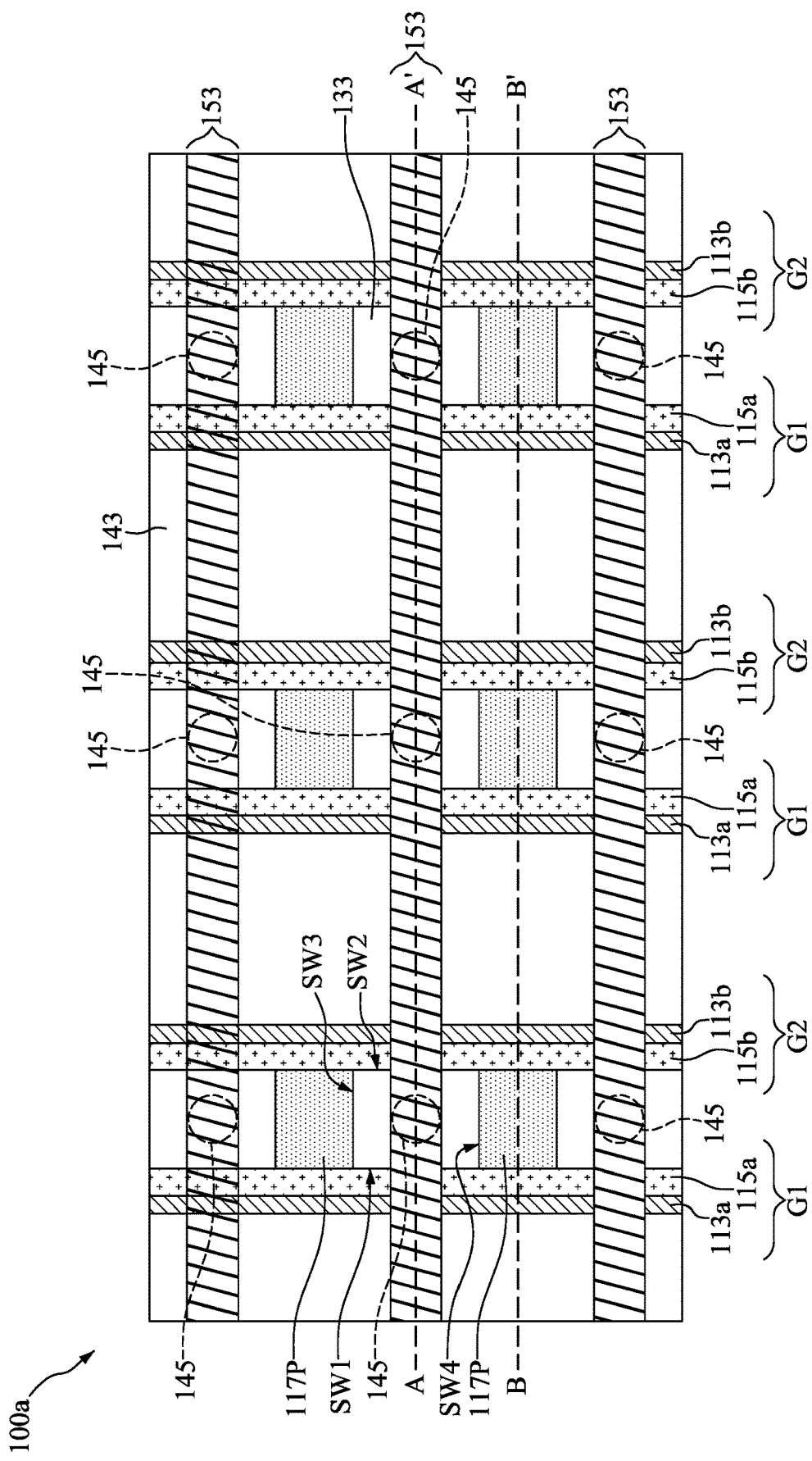
FIG. 1 is a top view illustrating a memory device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
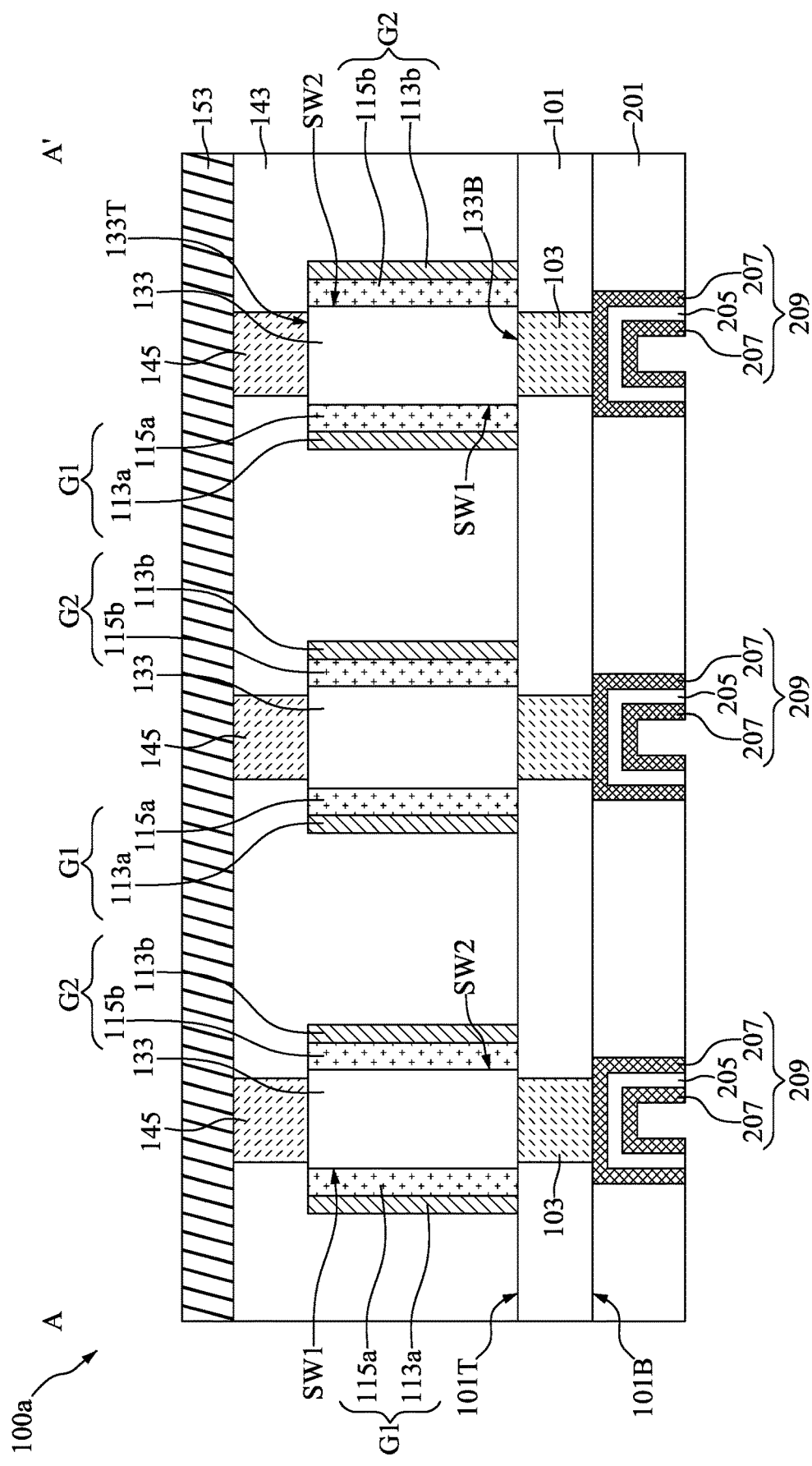
FIG. 2 is a cross-sectional view illustrating the memory device along the sectional line A-A' in FIG. 1 according to various embodiments of the present disclosure.
Figure 3:
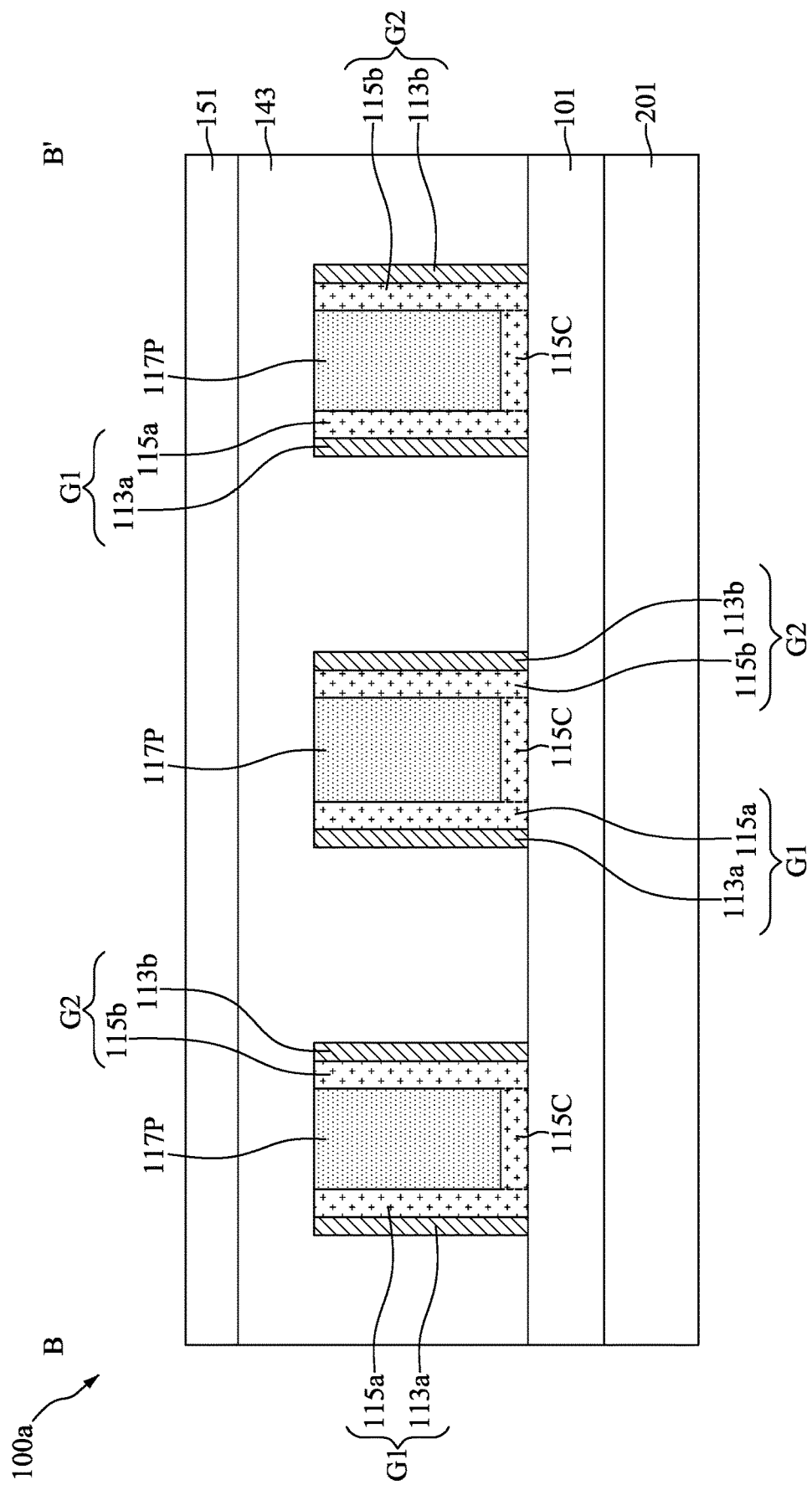
FIG. 3 is a cross-sectional view illustrating the memory device along the sectional line B-B' in FIG. 1 according to various embodiments of the present disclosure.

FIG. 1 is a top view illustrating a memory device 100a, FIG. 2 is a cross-sectional view illustrating the memory device 100a along the sectional line A-A' in FIG. 1, and FIG. 3 is a cross-sectional view illustrating the memory device 100a along the sectional line B-B' in FIG. 1, in accordance with some embodiments.

As shown in FIGS. 1 to 3, the memory device 100a includes a semiconductor substrate 101 (also referred to as a first semiconductor substrate), a dielectric layer 143 disposed over the semiconductor substrate 101, and a dielectric layer 151 disposed over the dielectric layer 143. In some embodiments, the memory device 100a includes a semiconductor substrate 201 (also referred to as a second semiconductor substrate) disposed below the semiconductor substrate 101. In other words, the dielectric layer 143 is disposed over a top surface 101T of the semiconductor substrate 101, and the semiconductor substrate 201 is bonded to a bottom surface 101B of the semiconductor substrate 101.

In some embodiments, the memory device 100a includes capacitors 209 disposed in the semiconductor substrate 201, and capacitor contacts 103 disposed in the semiconductor substrate 101. Specifically, each of the capacitors 209 includes conductive layers 203 and 207, and a dielectric layer 205 sandwiched between the conductive layers 203 and 207. In some embodiments, the memory device 100a also includes gate structures G1 (also referred to as first gate structures) disposed on the sidewalls SW1 of the channel structures 133, and gate structures G2 (also referred to as second gate structures) disposed on the sidewalls SW2 of the channel structure 133.

In some embodiments, each of the gate structures G1 includes a gate electrode 113a and a gate dielectric 115a sandwiched between the gate electrode 113a and the corresponding channel structure 133. In some embodiments, each of the gate structures G2 includes a gate electrode 113b and a gate dielectric 115b sandwiched between the gate electrode 113b and the corresponding channel structures 133. Moreover, the memory device 100a includes bit line contacts 145 disposed in the dielectric layer 143 and over the channel structures 133, and bit lines 153 disposed in the dielectric layer 151 and over the bit line contacts 145, in accordance with some embodiments.

In some embodiments, the channel structures 133 are electrically connected to the capacitors 209 and the bit lines 153 through the capacitor contacts 103 and the bit line contacts 145. In some embodiments, the capacitor contacts 103 are in direct contact with the bottom surfaces 133B of the channel structures 133, and the bit line contacts 145 are in direct contact with the top surfaces 133T of the channel structures 133.

In addition, the memory device 100a further includes dielectric portions 117P interleaved with the channel structures 133, as shown in FIGS. 1 and 3 in accordance with some embodiments. In some embodiments, each of the channel structures 133 has four sidewalls, the sidewalls SW1 and SW2 are in direct contact with the gate structures G1 and G2, and the sidewalls SW3 and SW4 are in direct contact with adjacent dielectric portions 117P. In some embodiments, the gate structures G1 and G2 extend to cover opposite sidewalls of the dielectric portions 117P.

Furthermore, the memory device 100a includes connecting portions 115c disposed between the dielectric portions 117P and the semiconductor substrate 101, as shown in FIG. 3 in accordance with some embodiments. In some embodiments, the gate dielectrics 115a of the gate structures G1 and the gate dielectrics 115b of the gate structures G2 are physically connected by the connecting portions 115c. It should be noted that the gate dielectrics 115a, the gate dielectrics 115b and the connecting portions 115c may be formed of the same material and formed from the same layer. In some embodiments, the memory device 100a is a dynamic random access memory (DRAM) with a vertical field effect transistor (VFET).

Figure 4:
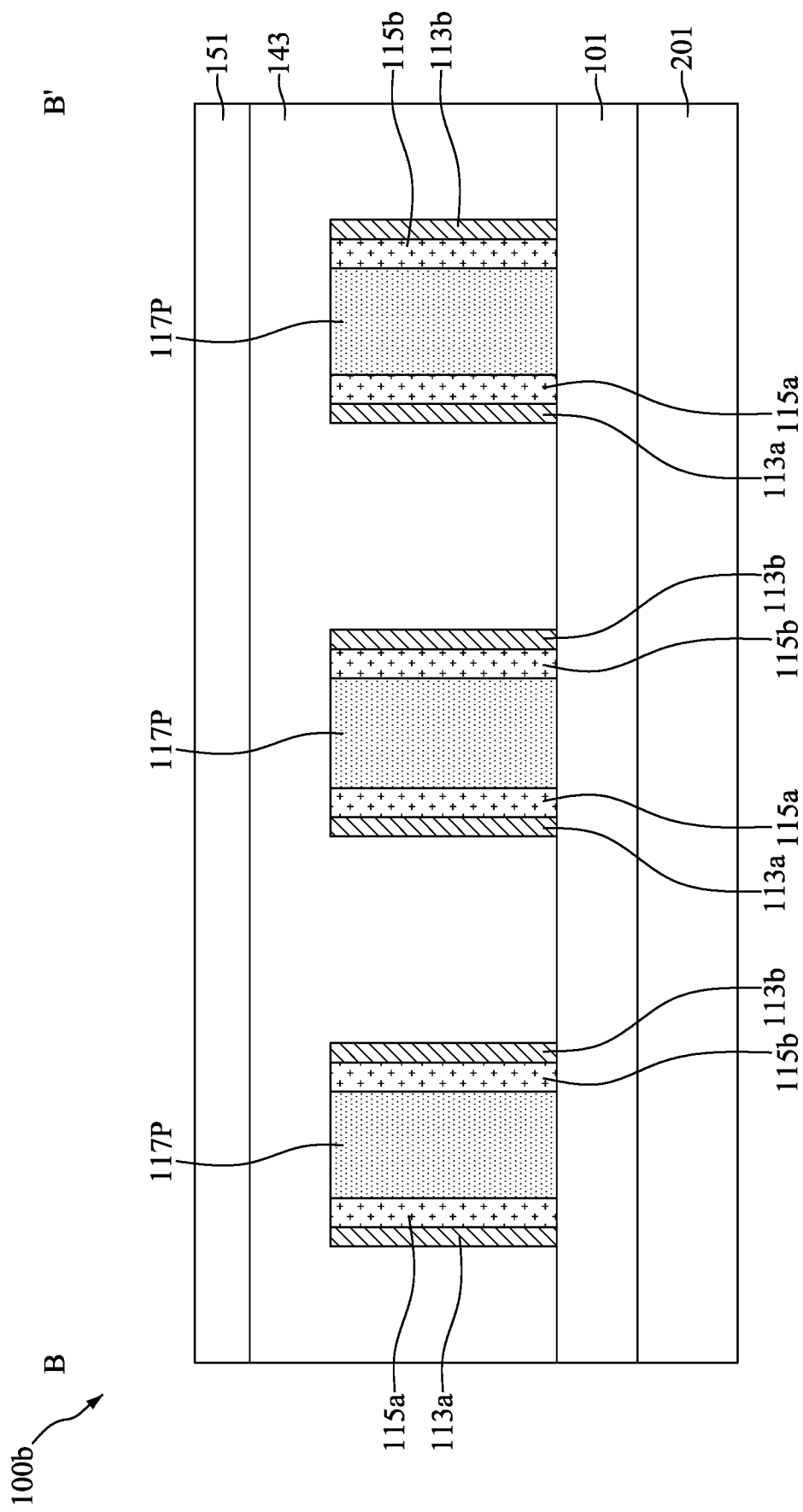
FIG. 4 is a cross-sectional view illustrating the memory device along the sectional line B-B' in FIG. 1 according to various embodiments of the present disclosure.

FIG. 4 is a cross-sectional view illustrating a memory device 100b along the sectional line B-B' in FIG. 1 according to various embodiments of the present disclosure. Note that the top view of FIG. 1 is also a top view of a memory device 100b, and the cross-sectional view of FIG. 2 is also a cross-sectional view taken along the sectional line A-A' of the memory device 100b. The structure of the memory device 100b may be similar to, or the same as, the structure of the memory device 100a, and the details thereof are not repeated herein. One of the differences between the memory device 100a and 100b is that the dielectric portions 117P of the memory device 100b are in direct contact with the semiconductor substrate 101 of the memory device 100b. Note that the memory device 100b does not include any connecting portion (e.g., the connecting portions 115c of the memory device 100a) connecting between the gate dielectrics 115a and 115b. In some embodiments, the memory device 100b is a DRAM with a VFET.

Figure 5:
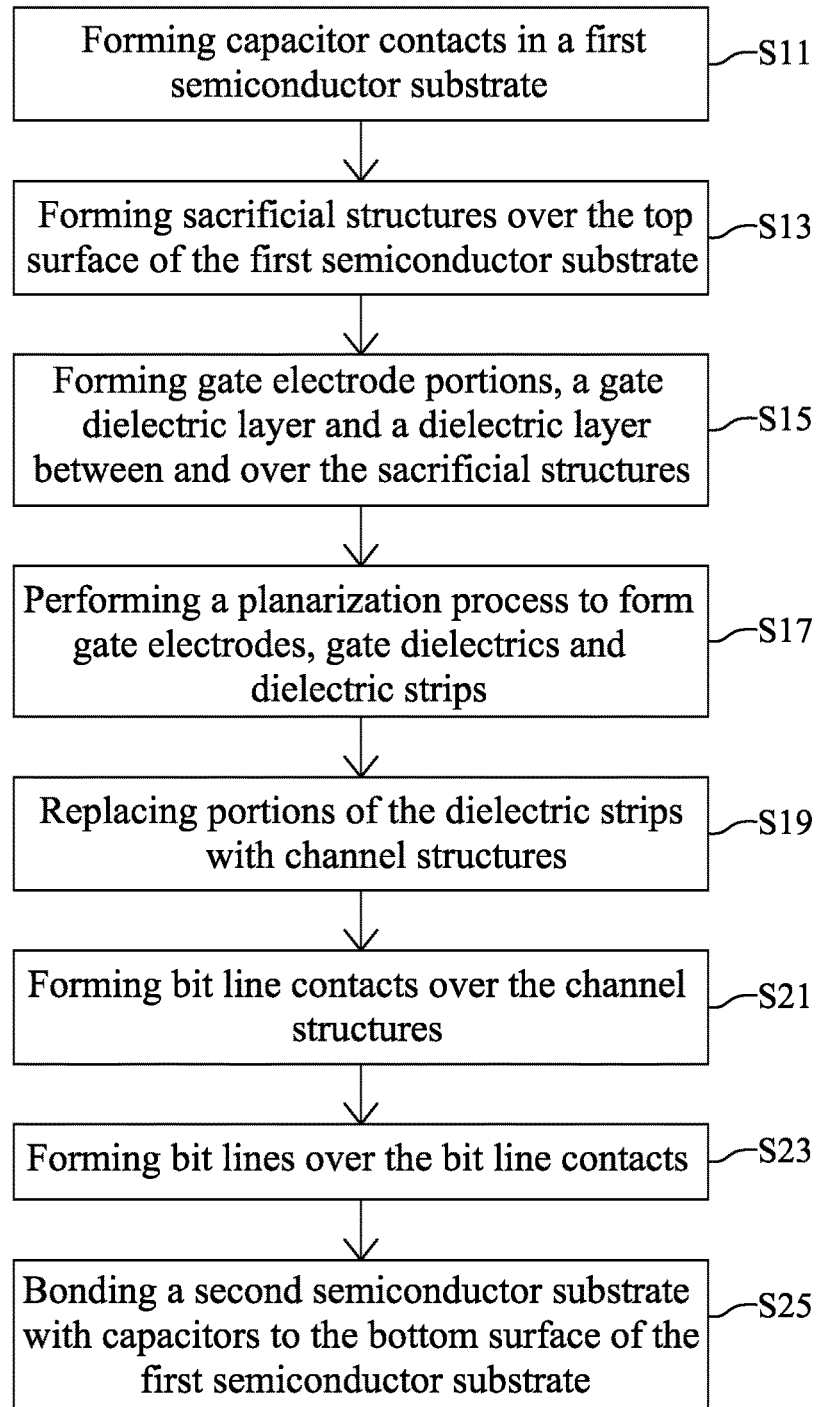
FIG. 5 is a flow diagram illustrating a method for forming a memory device according to various embodiments of the present disclosure.

FIG. 5 is a flow diagram illustrating a method 10 for forming a memory device (including the memory devices 100a and 100b), and the method 10 includes steps S11, S13, S15, S17, S19, S21, S23 and S25, in accordance with some embodiments. The steps S11 to S25 of FIG. 5 are elaborated in connection with the following figures.

FIGS. 6, 11, 13, 16, 19, 22, 25 and 28 are top views illustrating intermediate stages in the formation of the memory device 100a, and FIGS. 7, 8, 9, 10, 12, 14, 15, 17, 18, 20, 21, 23, 24, 26, 27, 29 and 30 are cross-sectional views illustrating intermediate stages in the formation of the memory device 100a, in accordance with some embodiments. It should be noted that FIGS. 7, 12, 14, 17, 20, 23, 26 and 29 are cross-sectional views along the sectional line A-A' of FIGS. 6, 11, 13, 16, 19, 22, 25 and 28, respectively, and FIGS. 15, 18, 21, 24, 27 and 30 are cross-sectional views along the sectional line B-B' of FIGS. 13, 16, 19, 22, 25 and 28, respectively.

Figure 6:
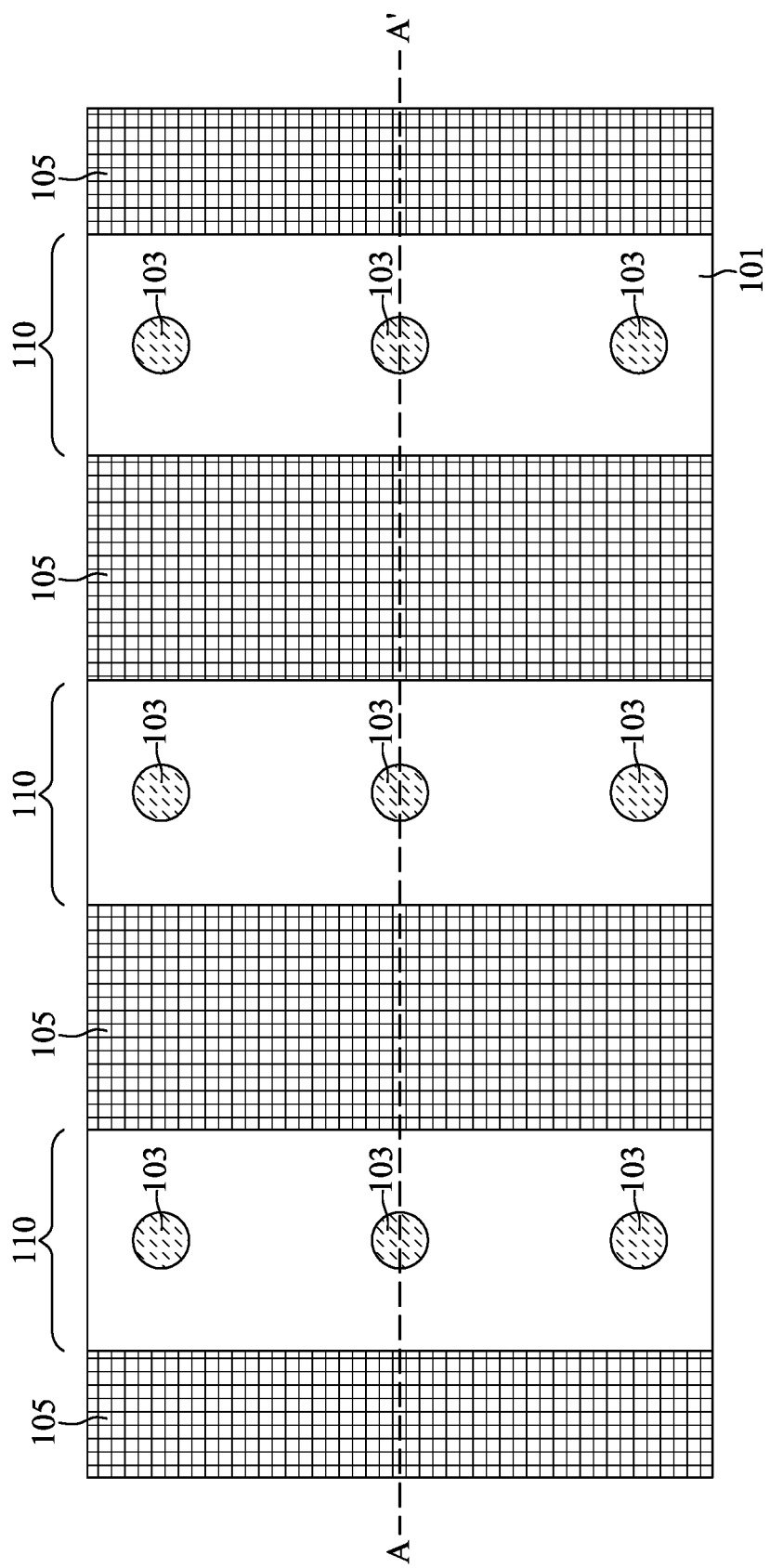
FIG. 6 is a top view illustrating an intermediate stage of forming sacrificial structures over a semiconductor substrate during the formation of the memory device according to various embodiments of the present disclosure.
Figure 7:
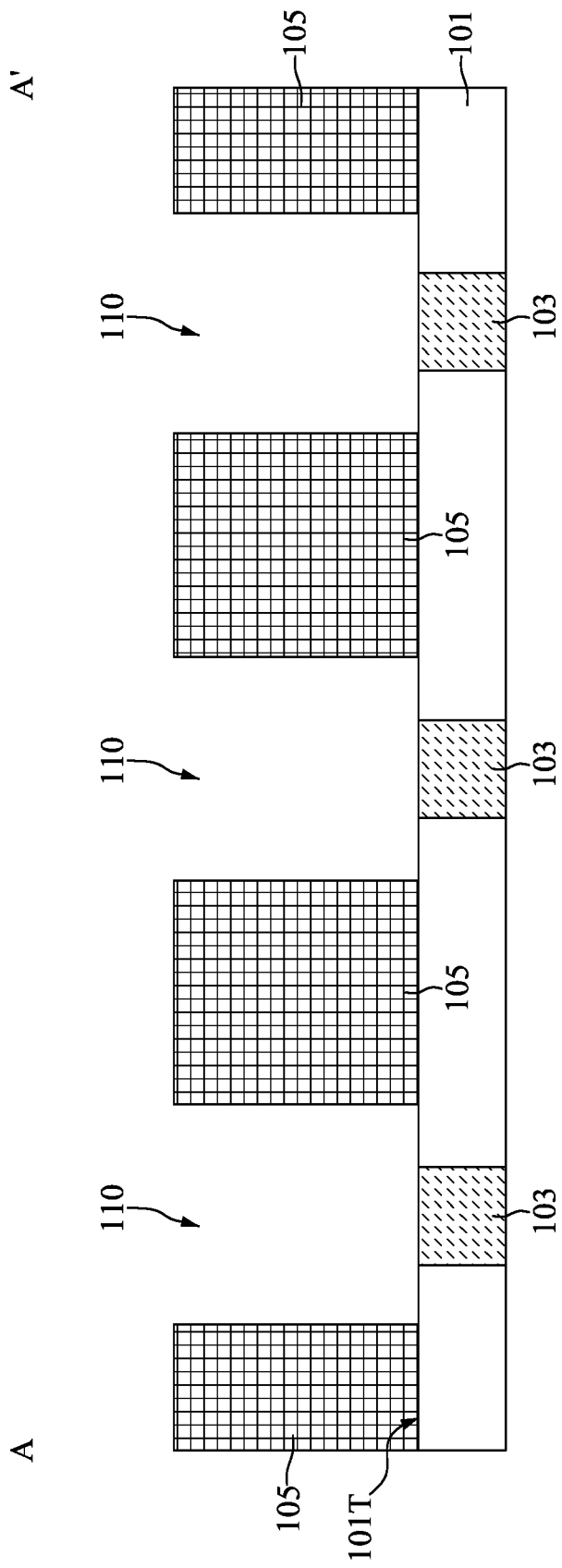
FIG. 7 is a cross-sectional view illustrating an intermediate stage in the formation of the memory device along the sectional line A-A' in FIG. 6 according to various embodiments of the present disclosure.

As shown in FIGS. 6 and 7, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIGS. 6 and 7, capacitor contacts 103 are formed in the semiconductor substrate 101, and sacrificial structures 105 are formed over the top surface 101T of the semiconductor substrate 101. The respective steps are illustrated as the steps S11 and S13 in the method 10 shown in FIG. 5. In some embodiments, the sacrificial structures 105 are arranged in parallel and separated from each other by openings 110, which expose the capacitor contacts 103 and portions of the top surface 101T of the semiconductor substrate 101.

In some embodiments, the capacitor contacts 103 are made of a conductive material, such as copper (Cu), tungsten (W), aluminum (Al), titanium (Ti), tantalum (Ta), gold (Au), silver (Ag). The method for forming the capacitor contacts 103 may include forming a patterned mask (not shown) over the top surface 101T of the semiconductor substrate 101, etching the semiconductor substrate 101 to form capacitor contact openings (not shown) using the patterned mask as a mask, depositing a conductive material in the capacitor contact openings and over the top surface 101T of the semiconductor substrate 101, and planarizing the conductive material until the top surface 101T of the semiconductor substrate 101 is exposed.

In addition, the sacrificial structures 105 are made of a metal material which is used for forming gate electrode portions in the subsequent process, in accordance with some embodiments. In some embodiments, the sacrificial structures 105 include copper (Cu), tungsten (W), aluminum (Al), titanium (Ti), tantalum (Ta), gold (Au), silver (Ag), nickel (Ni), iridium (Ir), ruthenium (Ru), or a combination thereof. The sacrificial structures 105 may be formed by a deposition process and a subsequent etching process. The deposition process may include chemical vapor deposition (CVD), atomic layer deposition (ALD), high density plasma CVD (HDPCVD), metal organic CVD (MOCVD), plasma enhanced CVD (PECVD), plasma enhanced ALD (PEALD), another suitable method, or a combination thereof. The etching process may be performed using a patterned mask (not shown), and the etching process may include a dry etching process, a wet etching process, or a combination thereof. After the openings 110 are formed by the etching process, the patterned mask may be removed.

Figure 8:
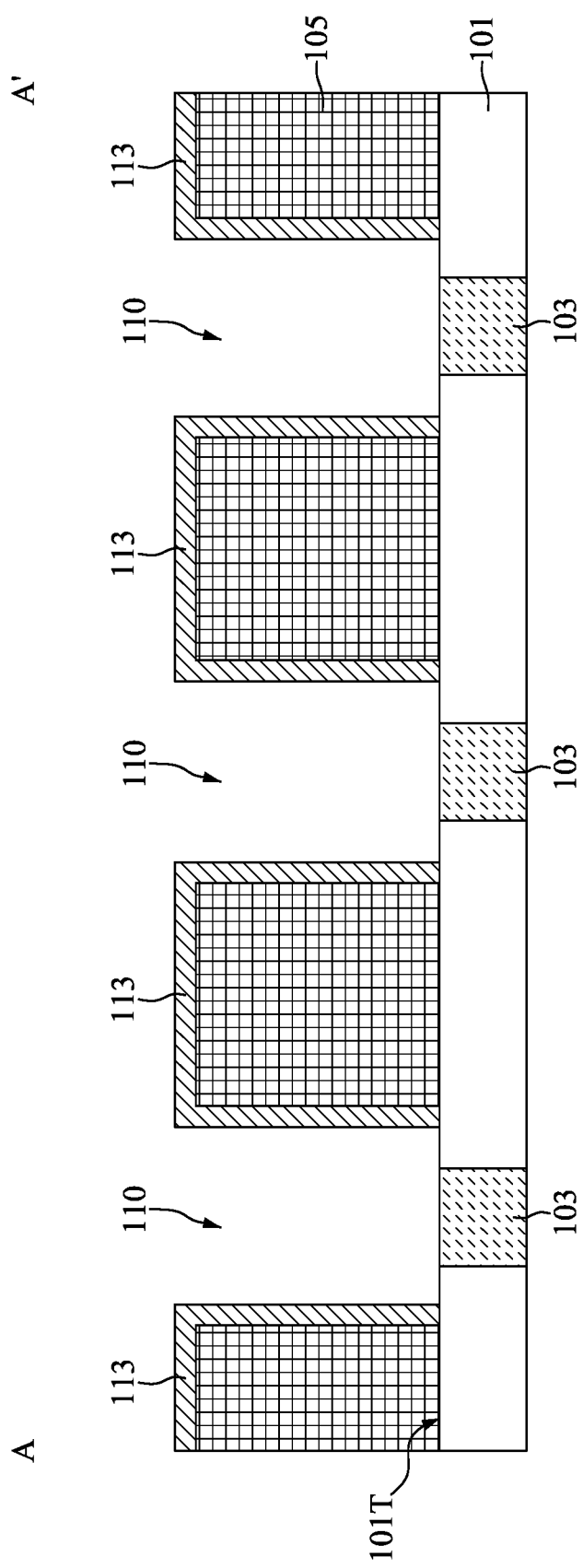
FIG. 8 is a cross-sectional view illustrating an intermediate stage of forming gate electrode portions over the sacrificial structures according to various embodiments of the present disclosure.

Next, gate electrode portions 113 are formed covering the top surfaces and the sidewalls of the sacrificial structures 105, as shown in FIG. 8 in accordance with some embodiments. In some embodiments, the gate electrode portions 113 are formed lining the sidewalls of the openings 110, leaving the bottom surface of the openings 110 exposed. That is, the capacitor contacts 103 and the portions of the top surface 101T of the semiconductor substrate 101 exposed by the openings 110 may remain uncovered.

In some embodiments, the gate electrode portions 113 is made of a conductive material, such as graphene. However, other suitable materials, such as copper (Cu), tungsten (W), aluminum (Al), titanium (Ti), tantalum (Ta), gold (Au), silver (Ag), nickel (Ni), iridium (Ir), ruthenium (Ru), or a combination thereof, may be used to form the gate electrode portions 113. In some embodiments, the gate electrode portions 113 are formed by a deposition process, such as CVD, ALD, MOCVD, PECVD, PEALD, another suitable method, or a combination thereof. Portions of the conductive material formed over the top surface 101T of the semiconductor substrate 101, if any, may be removed by an etching process.

Figure 9:
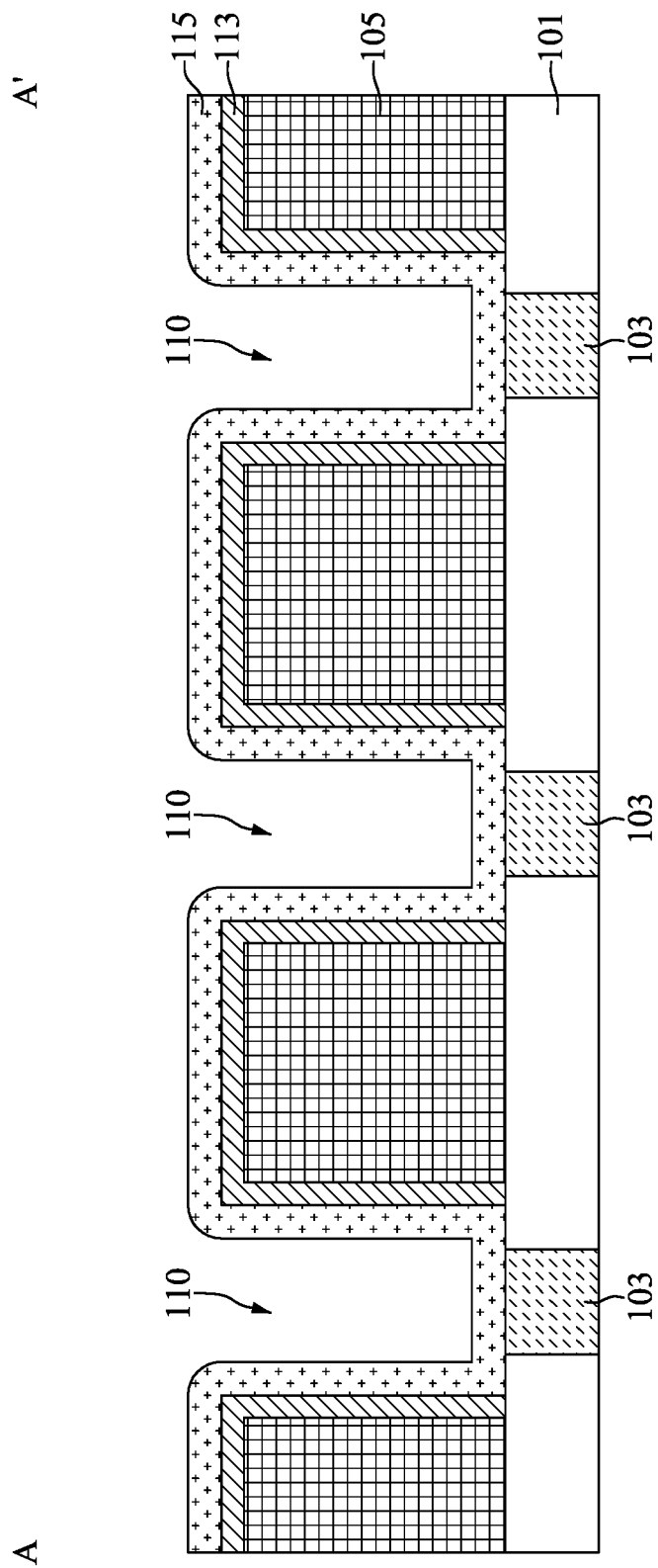
FIG. 9 is a cross-sectional view illustrating an intermediate stage of forming a gate dielectric layer over the gate electrode portions according to various embodiments of the present disclosure.

Subsequently, a gate dielectric layer 115 is conformally formed over the structure of FIG. 8, as shown in FIG. 9 in accordance with some embodiments. In some embodiments, the gate dielectric layer 115 is formed covering the sidewalls and the bottom surface of each of the openings 110 and extending over each of the sacrificial structures 105. Specifically, the gate dielectric layer 115 is formed covering the top surfaces and the sidewalls of the gate electrode portions 113, and covering the capacitor contacts 103 and portions of the top surface 101T of the semiconductor substrate 101 exposed by the openings 110.

The gate dielectric layer 115 may be a single layer or multiple layers. In some embodiments, the gate dielectric layer 115 is made of silicon oxide, silicon nitride, silicon oxynitride, dielectric material(s) with high dielectric constant (high-k), or a combination thereof. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another suitable material. The gate dielectric layer 115 may be formed by a deposition process, such as CVD, physical vapor deposition (PVD), ALD, PECVD, PEALD, another suitable method, or a combination thereof.

Figure 10:
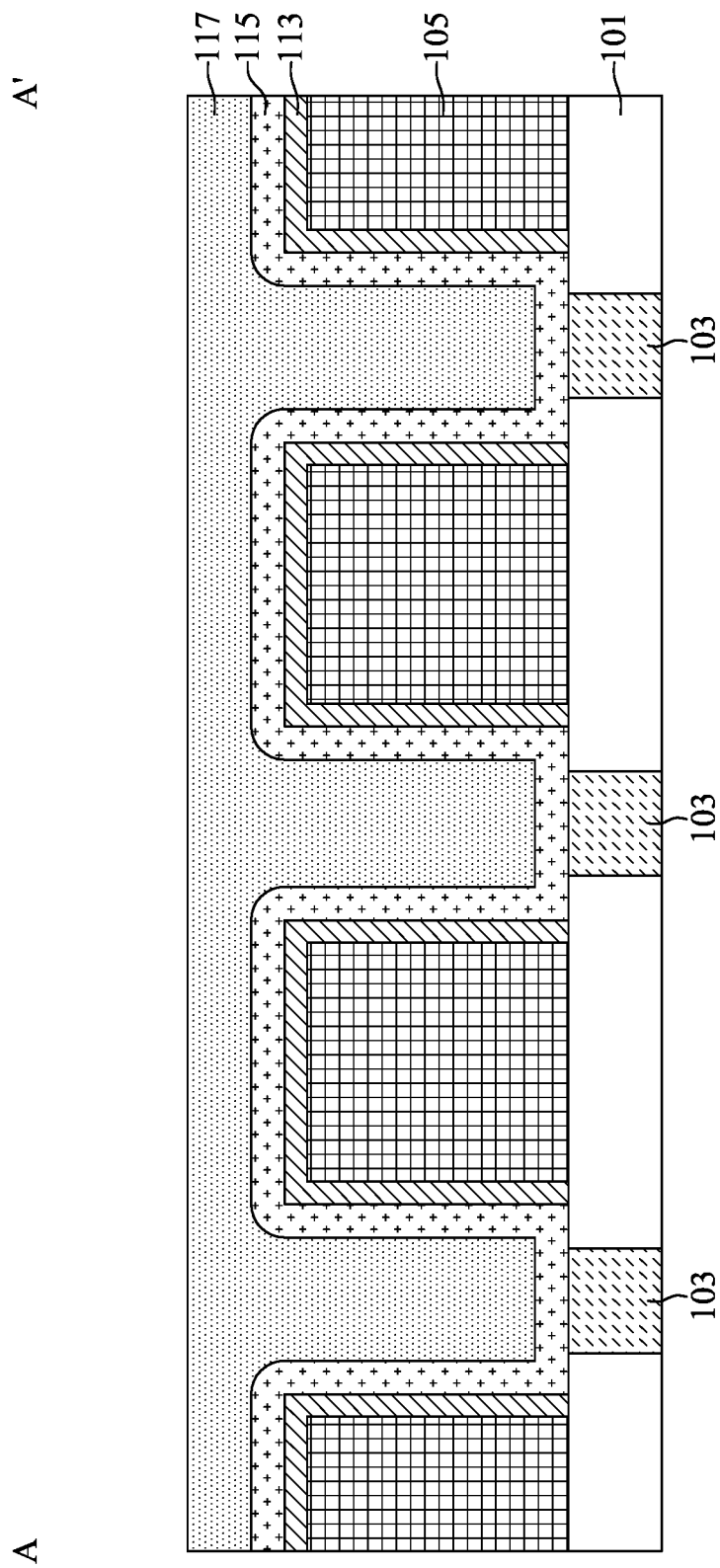
FIG. 10 is a cross-sectional view illustrating an intermediate stage of forming a dielectric layer over the gate dielectric layer according to various embodiments of the present disclosure.

Then, a dielectric layer 117 is formed over the gate dielectric layer 115 and filling the remaining portions of the openings 110, as shown in FIG. 10 in accordance with some embodiments. The respective steps shown in FIGS. 8-10 correspond to the step S15 in the method 10 shown in FIG. 5. In some embodiments, the dielectric layer 117 is made of silicon oxide, silicon nitride, silicon oxynitride, a low-k dielectric material or another suitable material. The dielectric layer 117 may be formed by a deposition process, such as CVD, PVD, ALD, spin-on coating, or another suitable method.

Figure 11:
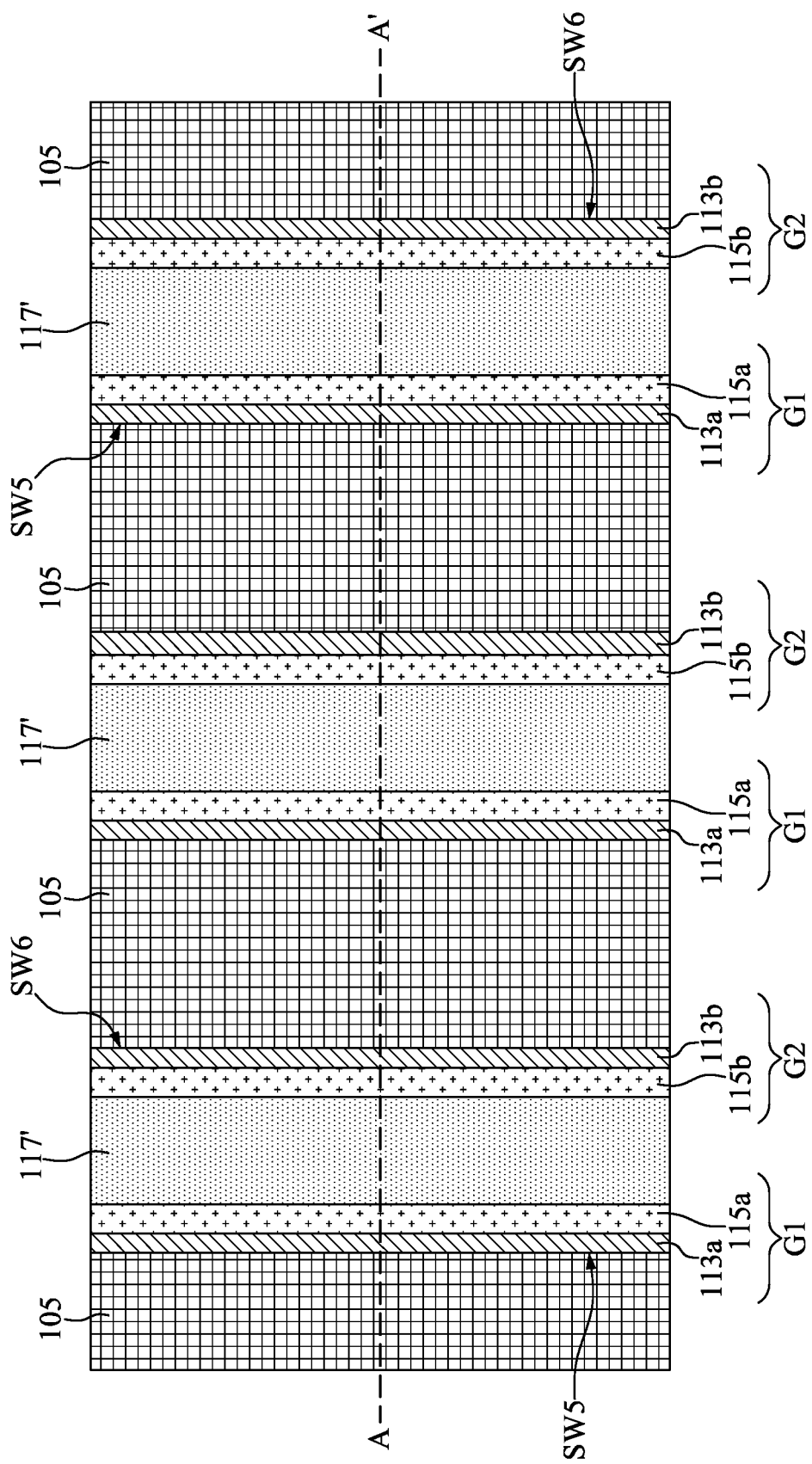
FIG. 11 is a top view illustrating an intermediate stage of performing a planarization process to form gate electrodes, gate dielectrics and dielectric strips during the formation of the memory device according to various embodiments of the present disclosure.
Figure 12:
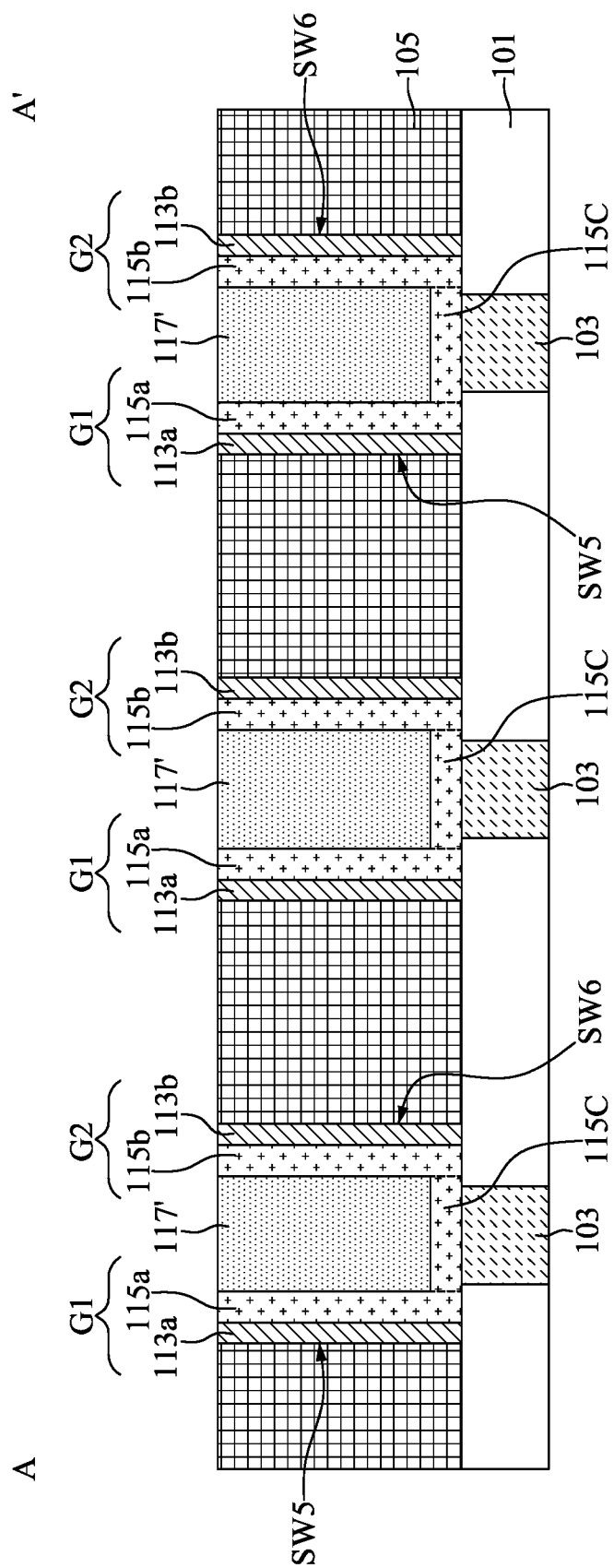
FIG. 12 is a cross-sectional view illustrating an intermediate stage in the formation of the memory device along the sectional line A-A' in FIG. 11 according to various embodiments of the present disclosure.

After the dielectric layer 117 is formed, a planarization process is performed on the gate electrode portions 113, the gate dielectric layer 115 and the dielectric layer 117 to remove excess materials over the sacrificial structures 105, such that gate electrodes 113a and 113b, gate dielectrics 115a and 115b, connecting portions 115c and dielectric strips 117' are obtained, as shown in FIGS. 11 and 12 in accordance with some embodiments. The respective step is illustrated as the step S17 in the method 10 shown in FIG. 5. In some embodiments, the planarization process may include a chemical mechanical polishing (CMP) process. Note that the gate electrodes 113 and 113b are the remaining of the gate electrode portions 113, and the remaining of the gate dielectric layer 115 include the gate dielectrics 115a and 115b, and the connecting portions 115c.

In some embodiments, each of the sacrificial structures 105 has a sidewall SW5 and an opposite sidewall SW6, and each of the sidewalls SW5 faces the sidewall SW6 of its adjacent sacrificial structure 105. In some embodiments, each of the gate electrodes 113a and its adjacent gate dielectric 115a collectively form a gate structure G1 (also referred to as a first gate structure) on the sidewall SW5 of the sacrificial structures 105, and each of the gate electrodes 113b and its adjacent gate dielectric 115b collectively form a gate structure G2 (also referred to as a second gate structure) on the sidewall SW6 of the sacrificial structures 105.

Moreover, in some embodiments, the gate dielectrics 115a of the gate structures G1 are physically connected to the gate dielectrics 115b of the gate structures G2 by the connecting portions 115c. In some embodiments, the capacitor contacts 103 are covered by the connecting portions 115c. In some embodiments, the connecting portions 115c are disposed between and in direct contact with the dielectric strips 117' (i.e., the remaining of the dielectric layer 117) and the capacitor contacts 103. Noted that the dotted lines indicating the locations of the connecting portions 115c are used to clarify the disclosure. No obvious interfaces exist between the connecting portions 115c and the gate dielectrics 115a and 115b.

Figure 13:
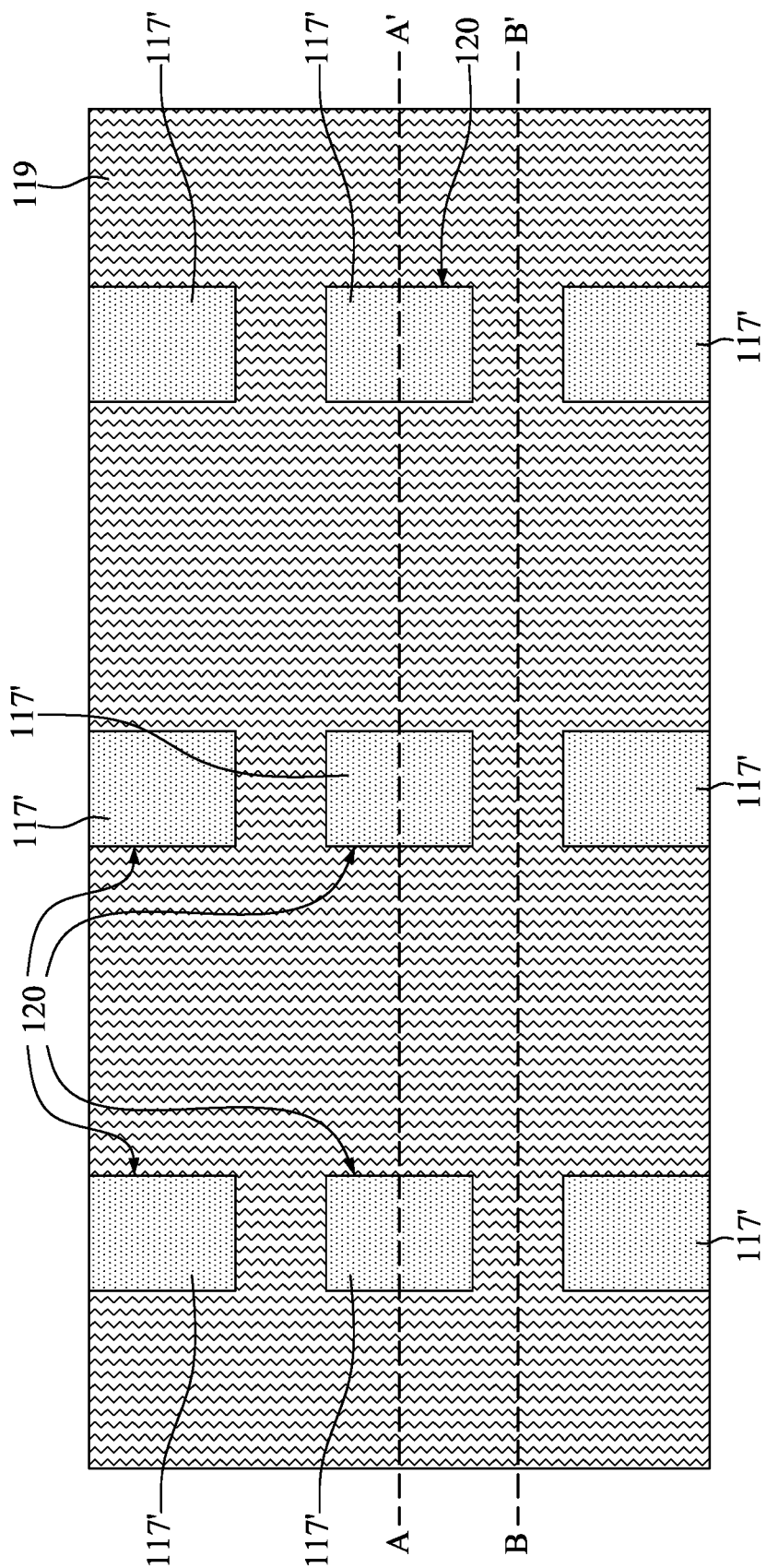
FIG. 13 is a top view illustrating an intermediate stage of forming a patterned mask during the formation of the memory device according to various embodiments of the present disclosure.
Figure 14:
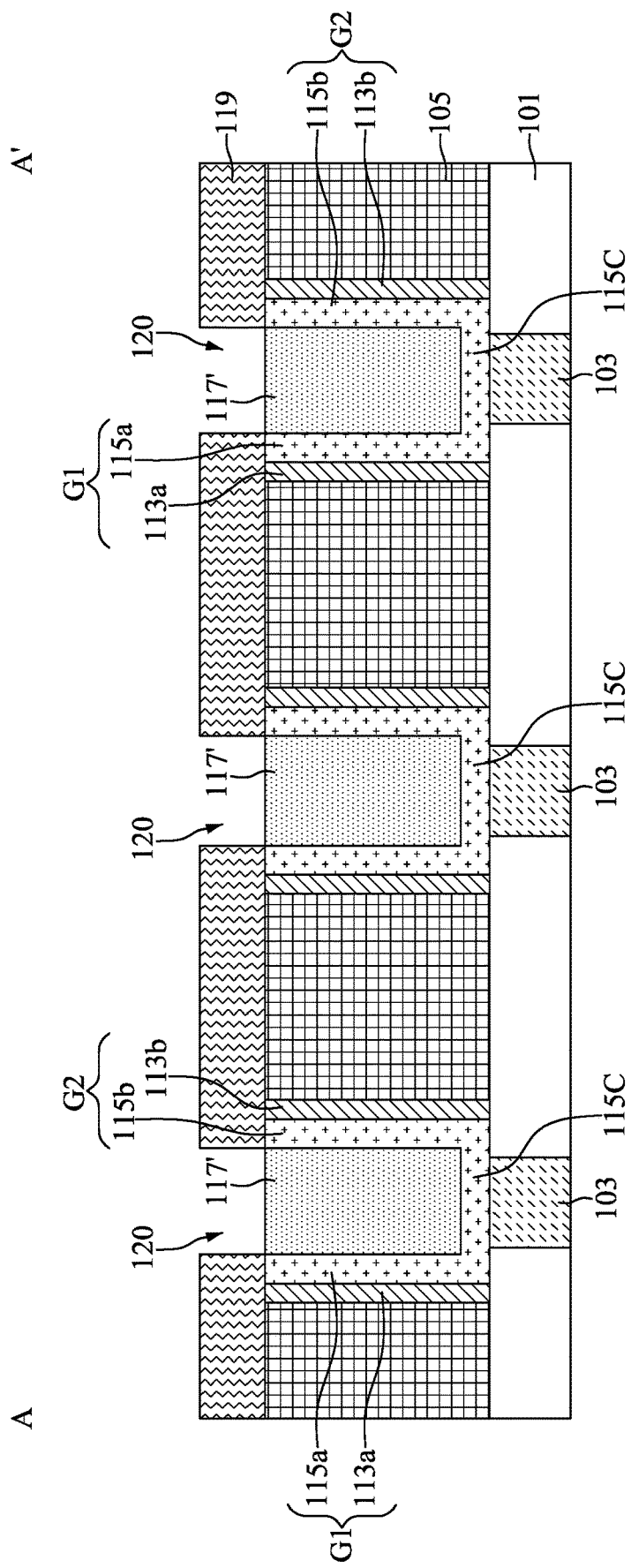
FIG. 14 is a cross-sectional view illustrating an intermediate stage in the formation of the memory device along the sectional line A-A' in FIG. 13 according to various embodiments of the present disclosure.
Figure 15:
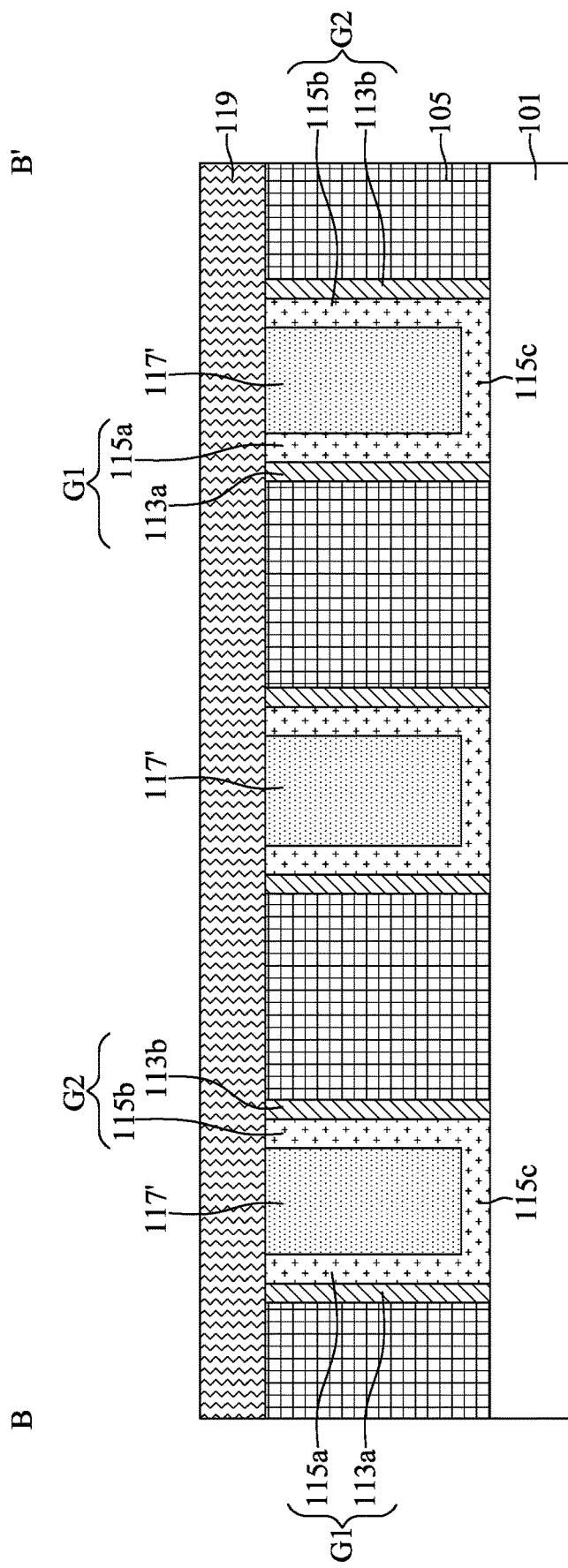
FIG. 15 is a cross-sectional view illustrating an intermediate stage in the formation of the memory device along the sectional line B-B' in FIG. 13 according to various embodiments of the present disclosure.

Next, a patterned mask 119 with openings 120 is formed over the structure of FIGS. 11 and 12, as shown in FIGS. 13-15 in accordance with some embodiments. In some embodiments, the openings 120 of the patterned mask 119 expose portions of the dielectric strips 117', as is clearly shown in FIG. 14. In other words, the other portions of the dielectric strips 117', the gate dielectrics 115a and 115b, the gate electrodes 113a and 113b, and the sacrificial structures 105 are covered by the patterned mask 119, as is clearly shown in FIG. in accordance with some embodiments.

Figure 16:
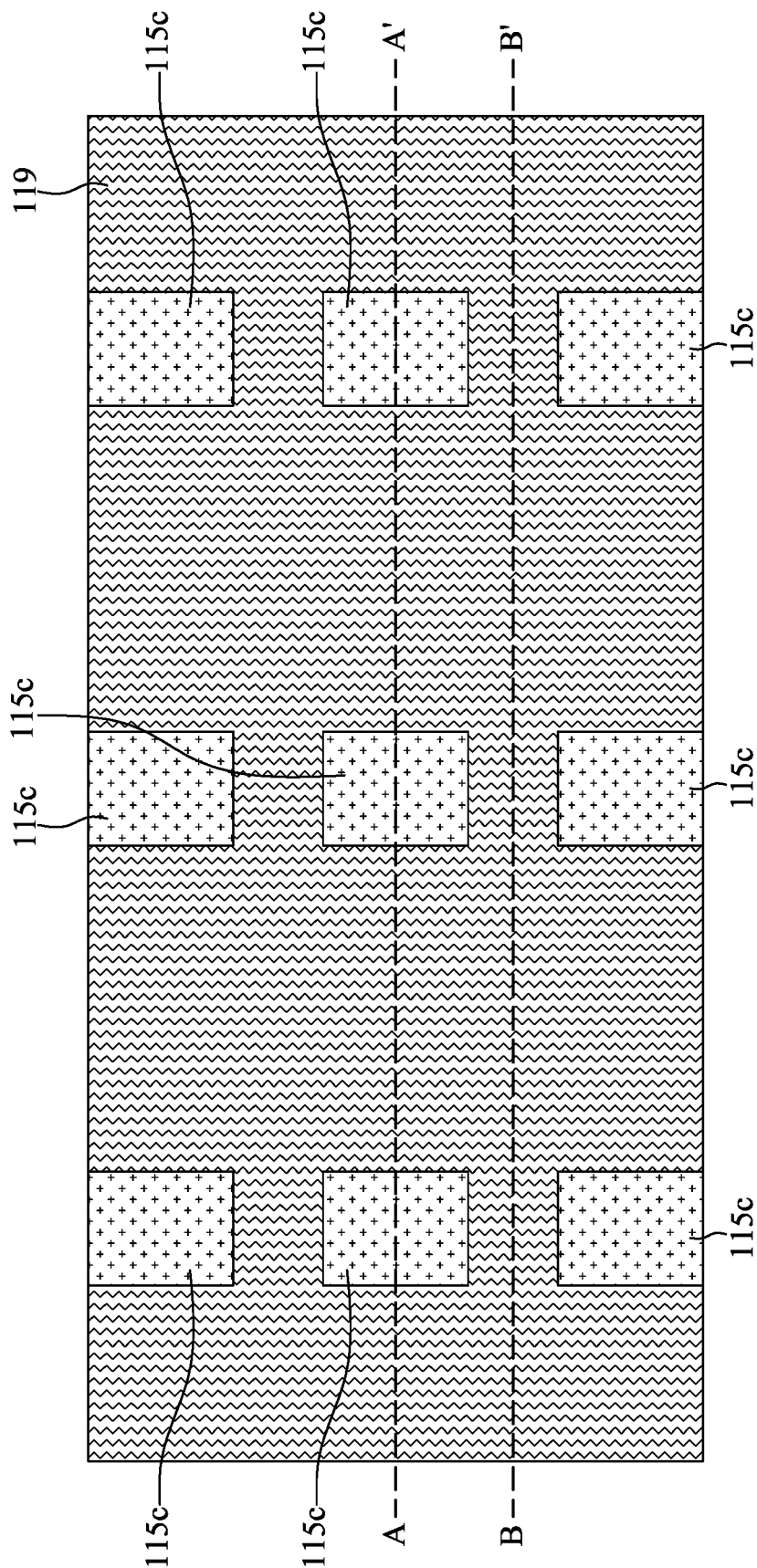
FIG. 16 is a top view illustrating an intermediate stage of etching the dielectric strips using the patterned mask as a mask to form openings during the formation of the memory device according to various embodiments of the present disclosure.
Figure 17:
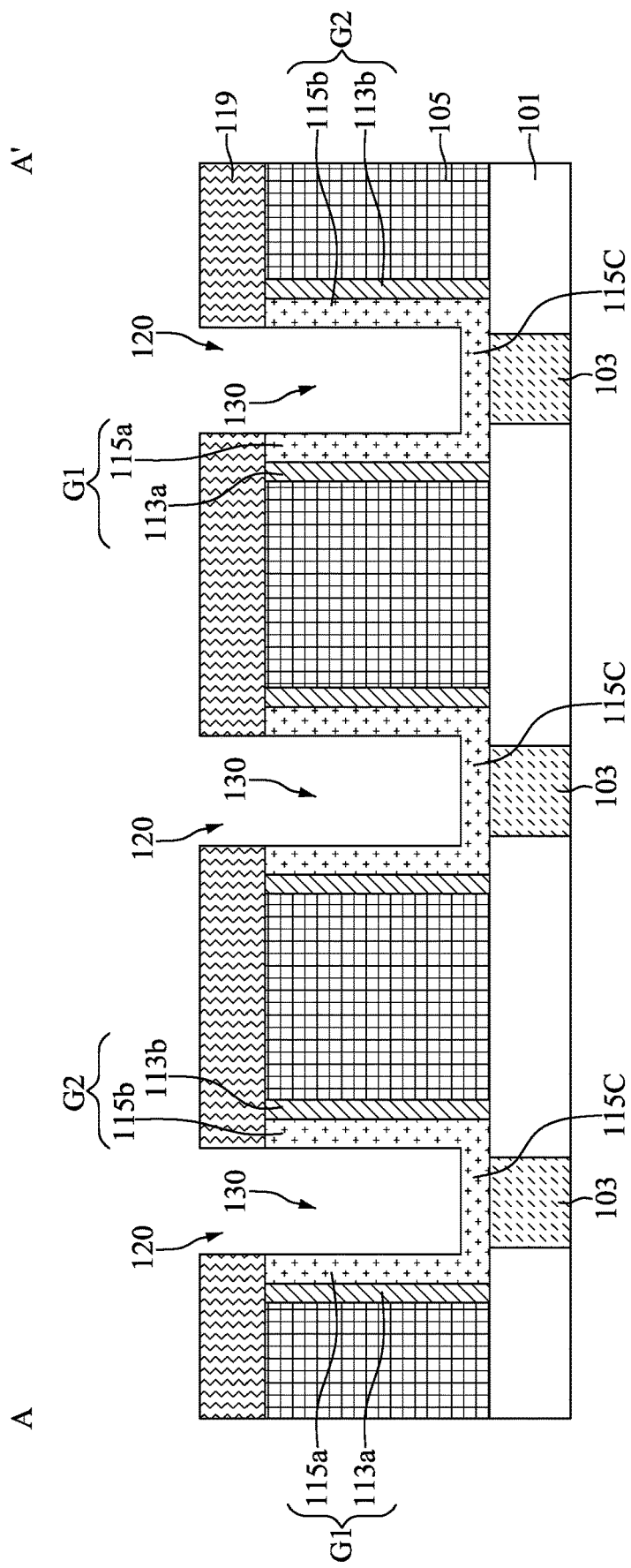
FIG. 17 is a cross-sectional view illustrating an intermediate stage in the formation of the memory device along the sectional line A-A' in FIG. 16 according to various embodiments of the present disclosure.
Figure 18:
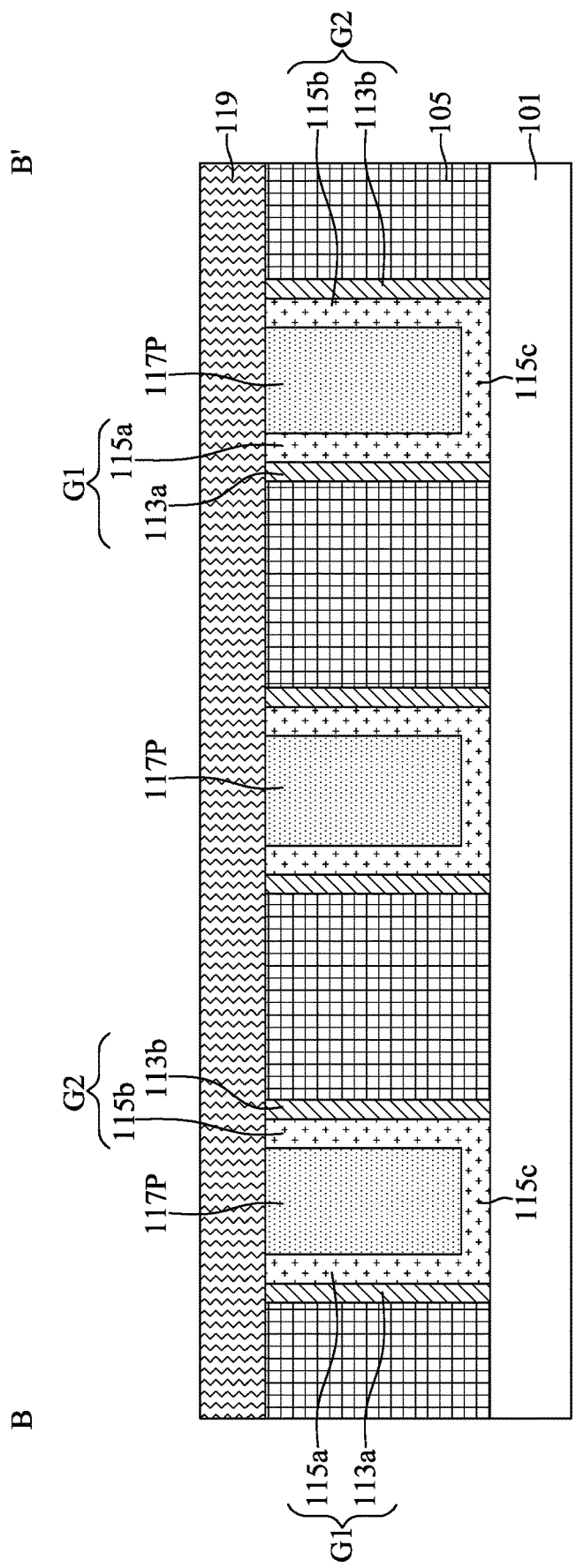
FIG. 18 is a cross-sectional view illustrating an intermediate stage in the formation of the memory device along the sectional line B-B' in FIG. 16 according to various embodiments of the present disclosure.

Subsequently, referring to FIGS. 16-24, the portions of the dielectric strips 117' exposed by the patterned mask 119 are replaced by channel structures 133, in accordance with some embodiments. The respective step is illustrated as the step S19 in the method 10 shown in FIG. 5. As shown in FIGS. 16-18, an etching process is performed on the dielectric strips 117' using the patterned mask 119 as a mask, in accordance with some embodiments. The etching process may be a wet etching process, a dry etching process, and a combination thereof.

In some embodiments, the portions of the dielectric strips 117' exposed by the openings 120 of the patterned mask 119 are removed to form openings 130, while the portions of the dielectric strips 117' covered by the patterned mask 119 remain substantially un-etched. Within the context of this disclosure, the word "substantially" means preferably at least 90%, more preferably 95%, even more preferably 98%, and most preferably 99%. The remaining of the dielectric strips 117' is also referred to as dielectric portions 117P, as shown in FIG. 18 in accordance with some embodiments. In some embodiments, the sidewalls of the dielectric portions 117P not covered by the gate structures G1 and G2 are exposed by the openings 130.

Figure 19:
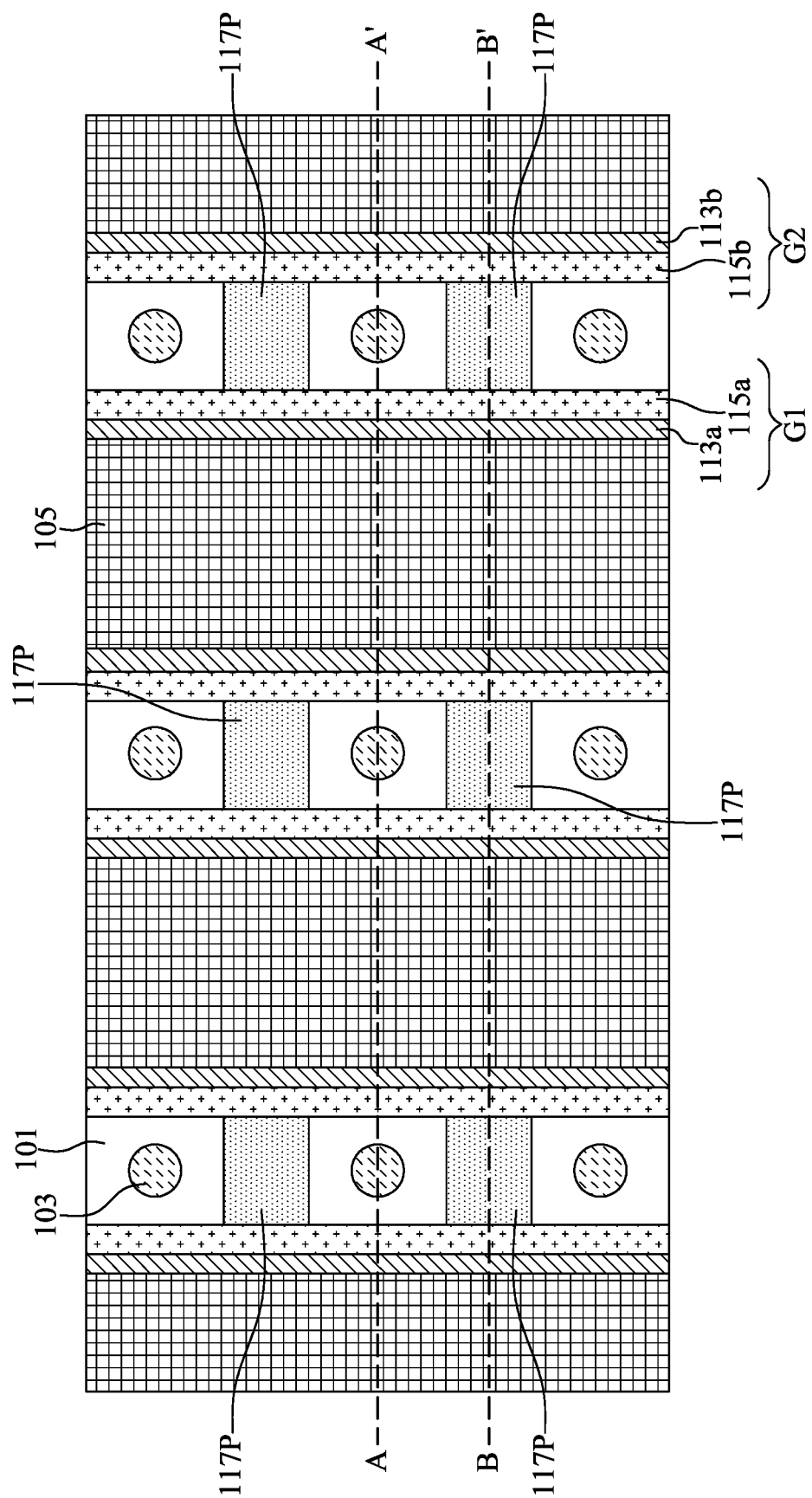
FIG. 19 is a top view illustrating an intermediate stage of etching the gate dielectrics using the patterned mask as a mask to deepen the openings during the formation of the memory device according to various embodiments of the present disclosure.
Figure 20:
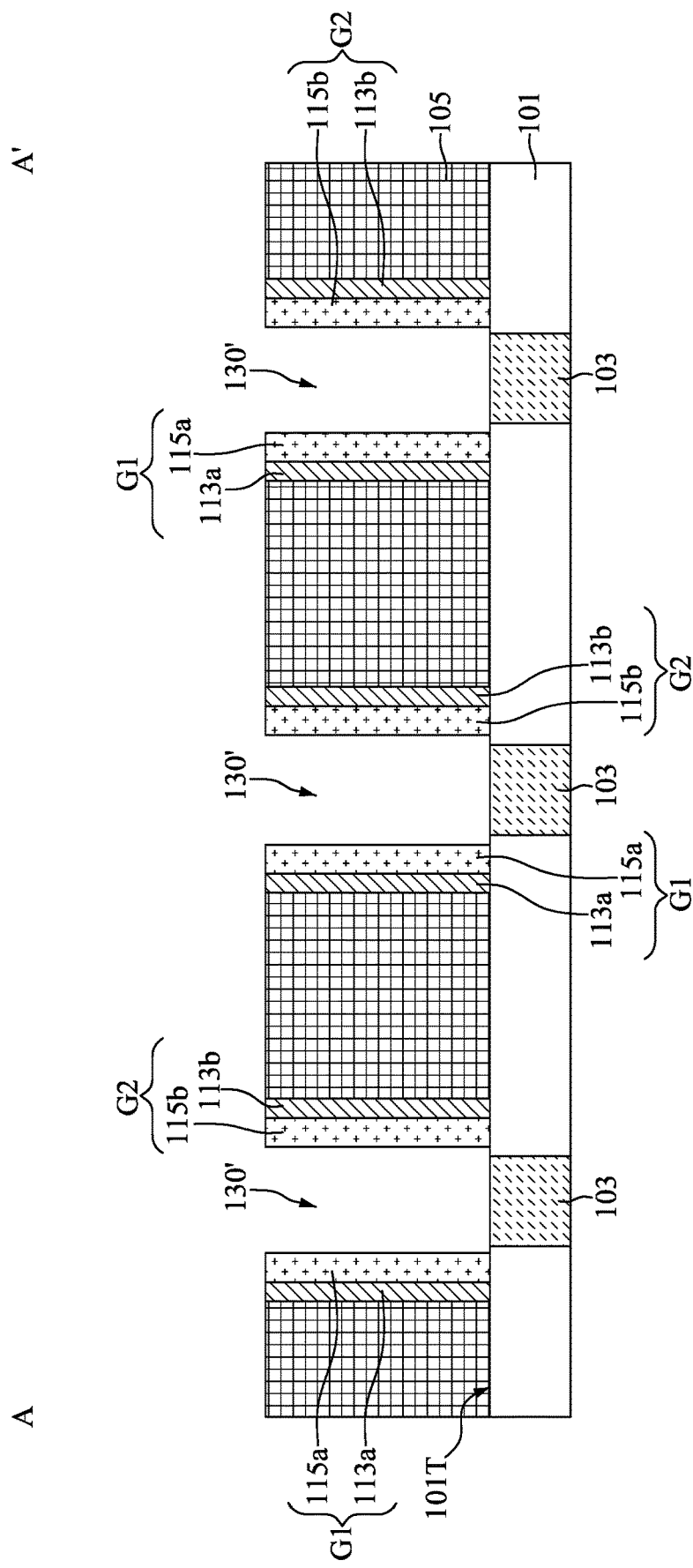
FIG. 20 is a cross-sectional view illustrating an intermediate stage in the formation of the memory device along the sectional line A-A' in FIG. 19 according to various embodiments of the present disclosure.
Figure 21:
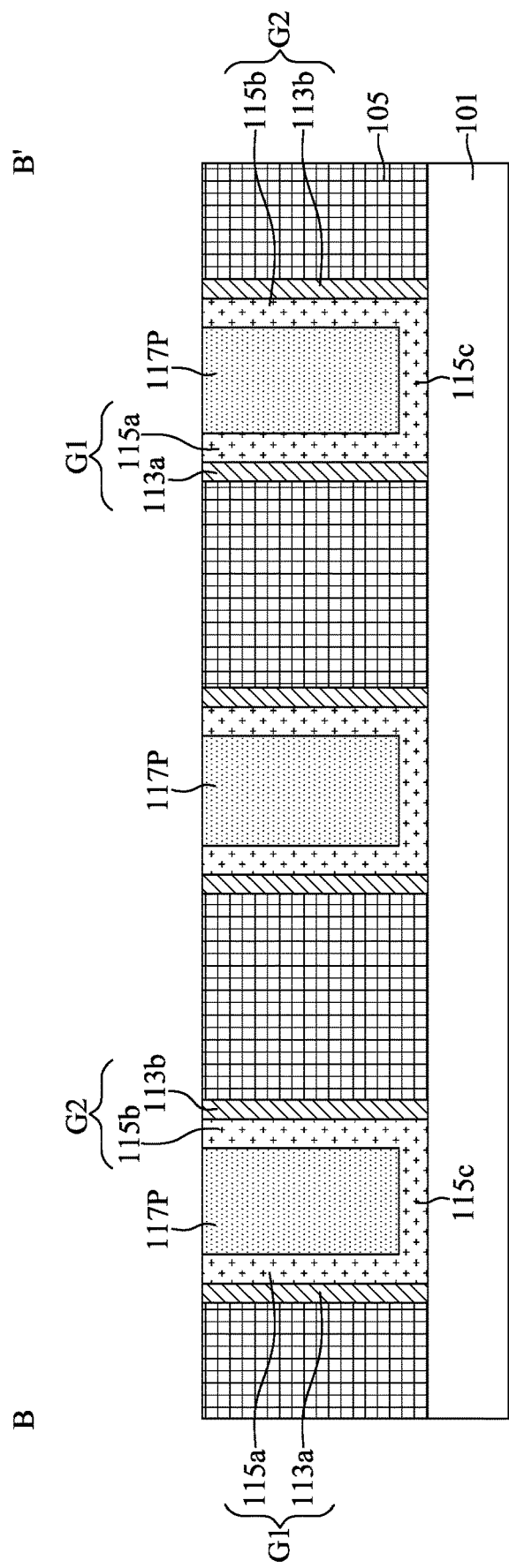
FIG. 21 is a cross-sectional view illustrating an intermediate stage in the formation of the memory device along the sectional line B-B' in FIG. 19 according to various embodiments of the present disclosure.

Then, an etching process is performed on the connecting portions 115c to extend (e.g., deepen) the openings 130, as shown in FIGS. 19-21 in accordance with some embodiments. The etching process may be a wet etching process, a dry etching process, and a combination thereof. In some embodiments, the portions of the connecting portions 115c exposed by the openings 130 are removed, while the portions of the connecting portions 115c covered by the dielectric portions 117P remain substantially un-etched.

After the etching process, the openings 130' exposing the capacitor contacts 103 are obtained. In some embodiments, portions of the top surface 101T of the semiconductor substrate 101 and portions of the gate structures G1 and G2 are exposed by the openings 130'. In some embodiments, the sidewalls of the remaining of the connecting portions 115c are exposed by the openings 130'. After the capacitor contacts 103 are exposed by the openings 130', the patterned mask 119 may be removed.

Figure 22:
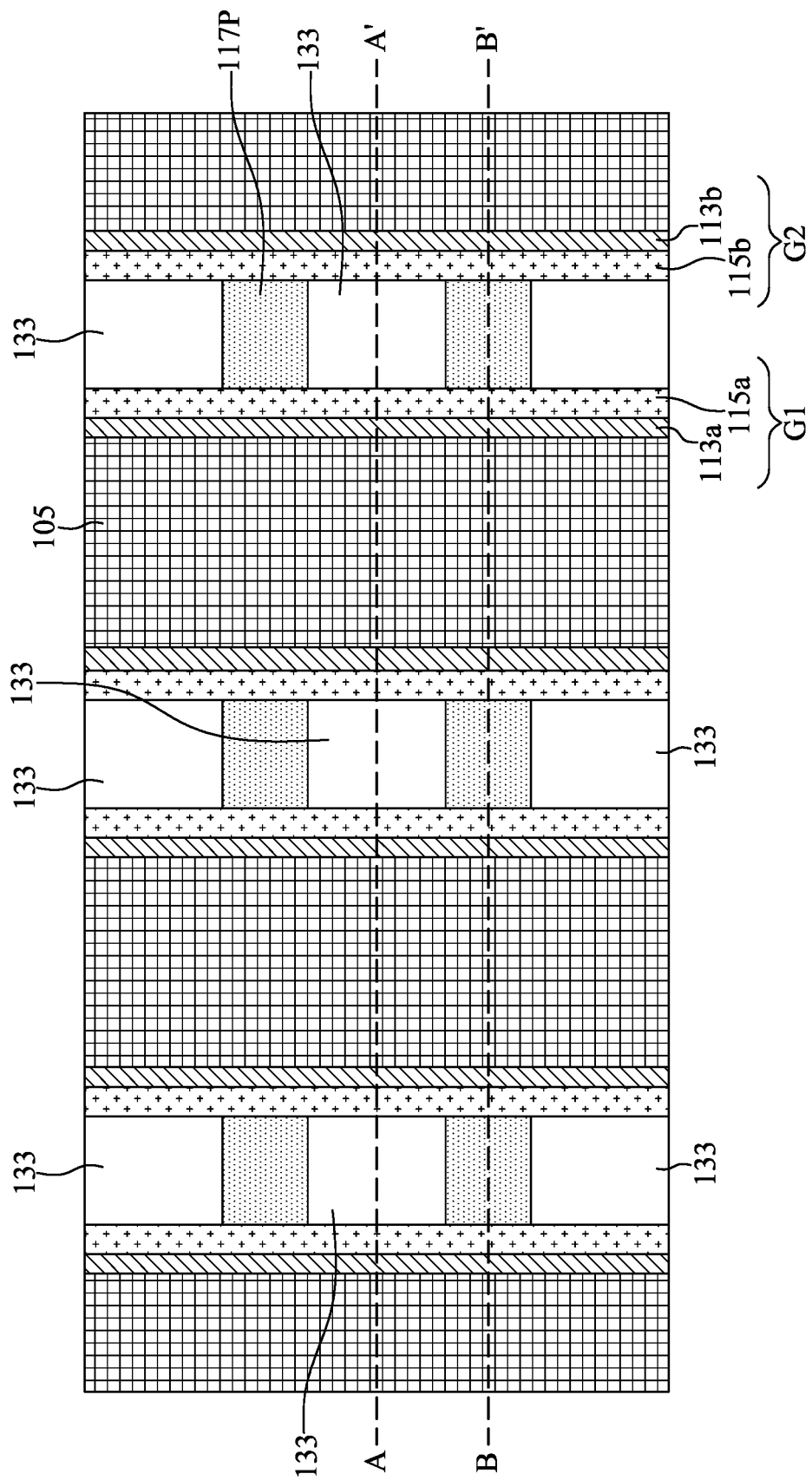
FIG. 22 is a top view illustrating an intermediate stage of filling the openings with channel structures during the formation of the memory device according to various embodiments of the present disclosure.
Figure 23:
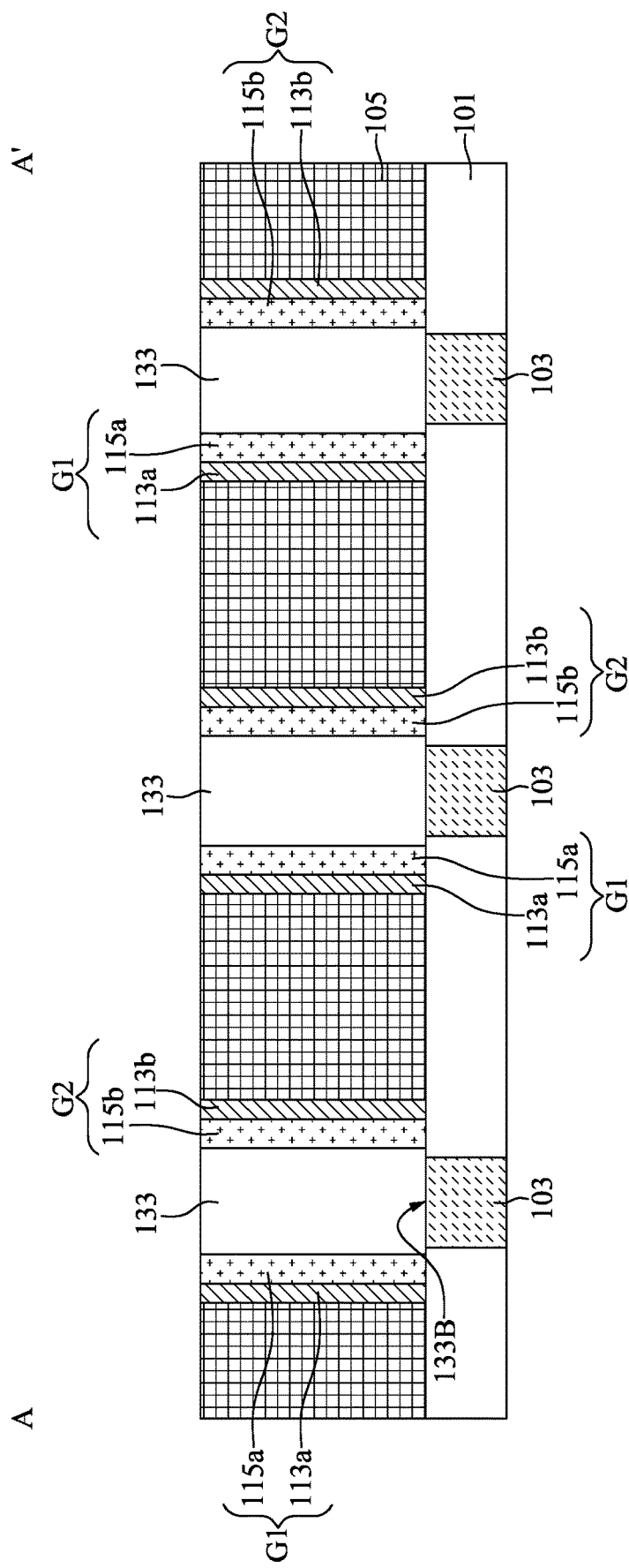
FIG. 23 is a cross-sectional view illustrating an intermediate stage in the formation of the memory device along the sectional line A-A' in FIG. 22 according to various embodiments of the present disclosure.
Figure 24:
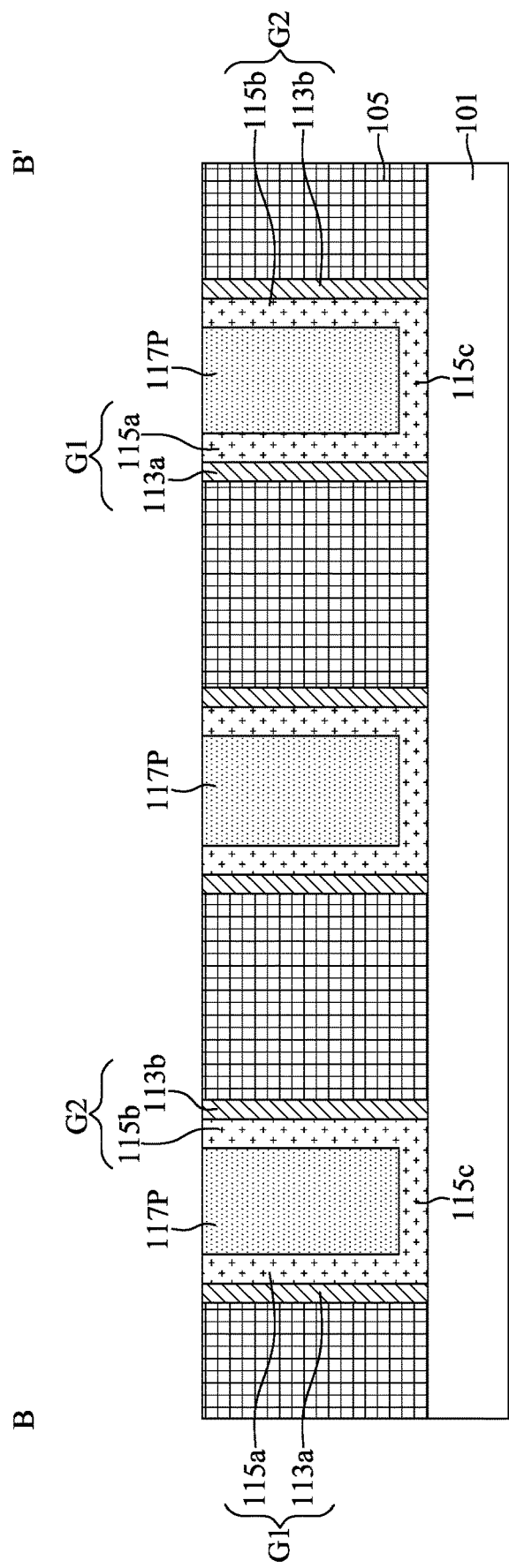
FIG. 24 is a cross-sectional view illustrating an intermediate stage in the formation of the memory device along the sectional line B-B' in FIG. 22 according to various embodiments of the present disclosure.

After the capacitor contacts 103 are exposed, the openings 130' are filled with the channel structures 133, as shown in FIGS. 22-24 in accordance with some embodiments. In some embodiments, the channel structures 133 are interleaved between the dielectric portions 117P, and the sidewalls of the channel structures 133 not covered by the gate structures G1 and G2 are in direct contact with the dielectric portions 117P. In some embodiments, the bottom surface 133B of the channel structures 133 are in direct contact with the capacitor contacts 103.

In some embodiments, the channel structures 133 include silicon, indium tin oxide (ITO), indium zinc oxide (IZO), indium gallium zinc oxide (IGZO), another suitable material, or a combination thereof. The channel structures 133 may be formed by a deposition process and a subsequent planarization process. The deposition process may include CVD, PVD, ALD, PECVD, PEALD, spin-on coating, another suitable method, or a combination thereof. The planarization process may include CMP.

Figure 25:
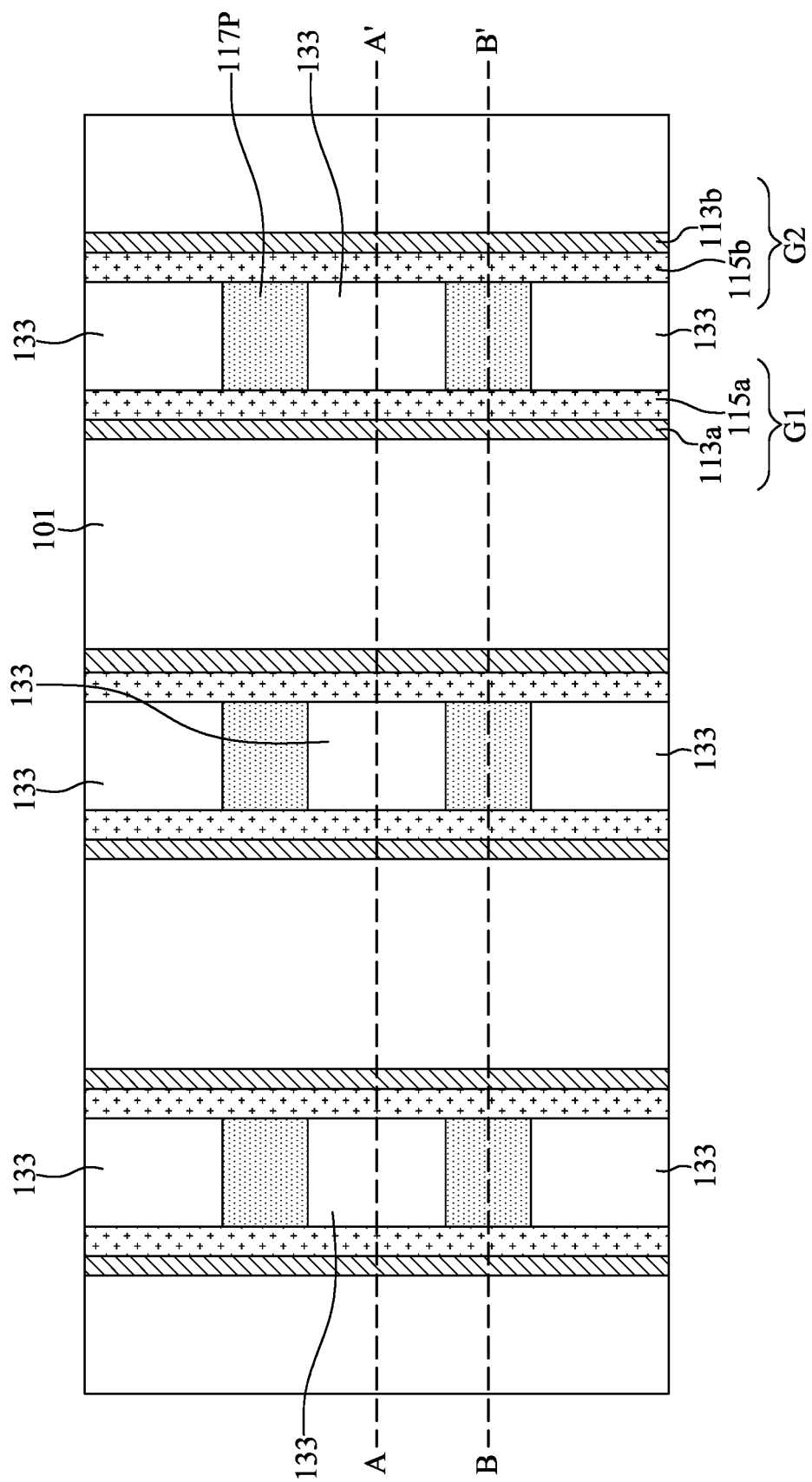
FIG. 25 is a top view illustrating an intermediate stage of removing the sacrificial structures during the formation of the memory device according to various embodiments of the present disclosure.
Figure 26:
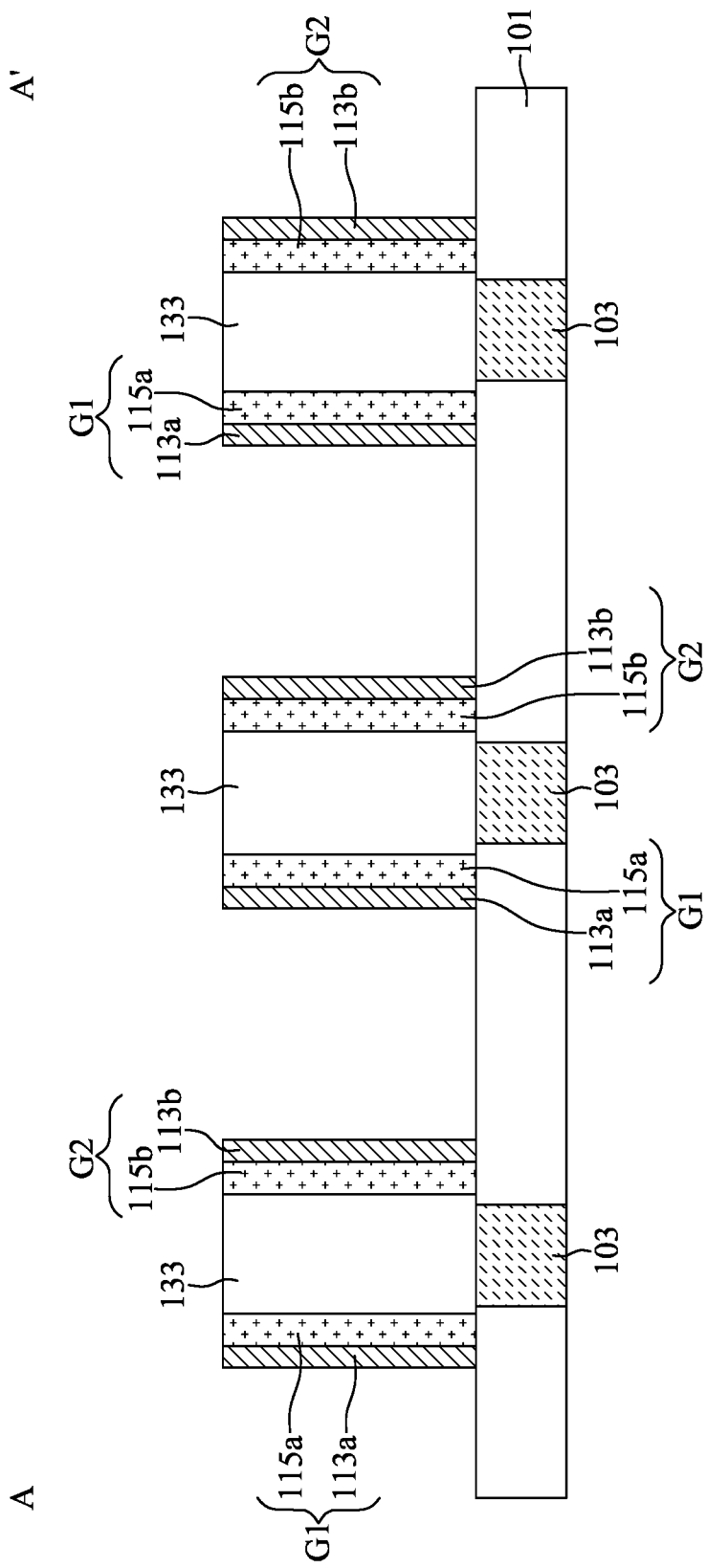
FIG. 26 is a cross-sectional view illustrating an intermediate stage in the formation of the memory device along the sectional line A-A' in FIG. 25 according to various embodiments of the present disclosure.
Figure 27:
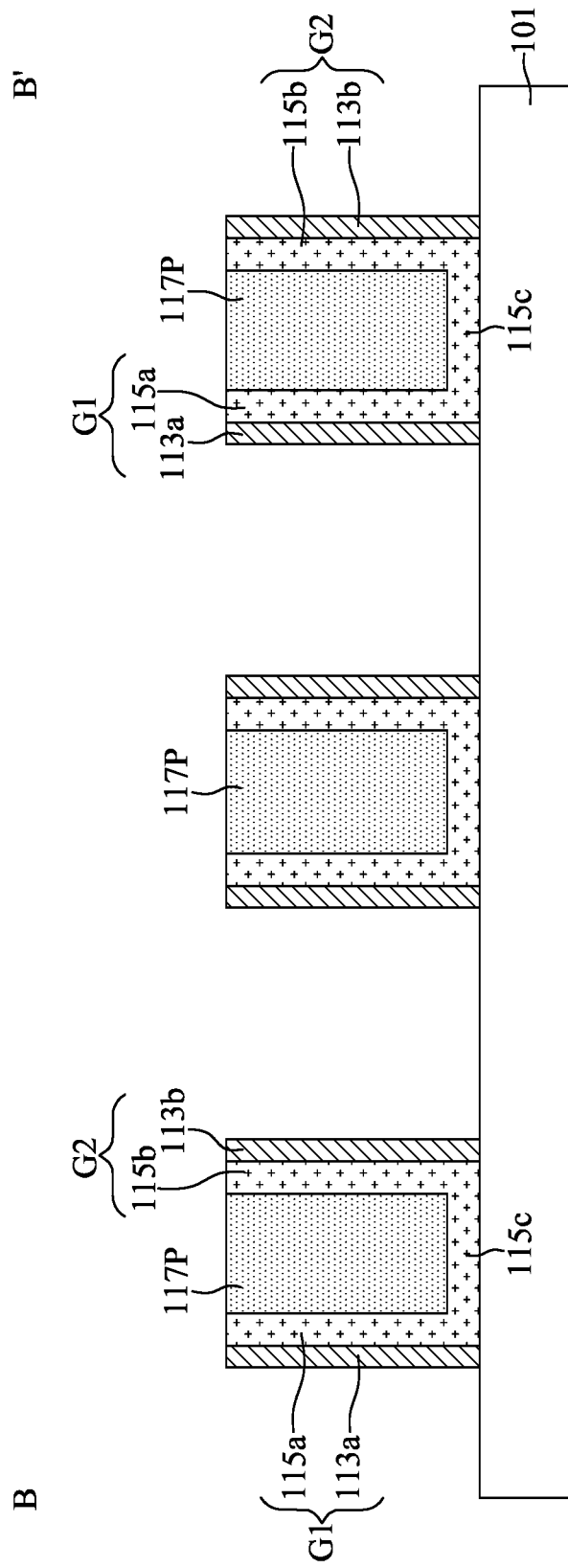
FIG. 27 is a cross-sectional view illustrating an intermediate stage in the formation of the memory device along the sectional line B-B' in FIG. 25 according to various embodiments of the present disclosure.

Subsequently, the sacrificial structures 105 are removed, as shown in FIGS. 25-27 in accordance with some embodiments. In some embodiments, the sacrificial structures 105 are removed by an etching process. The etching process may include a dry etching process, a wet etching process, or a combination thereof.

Figure 28:
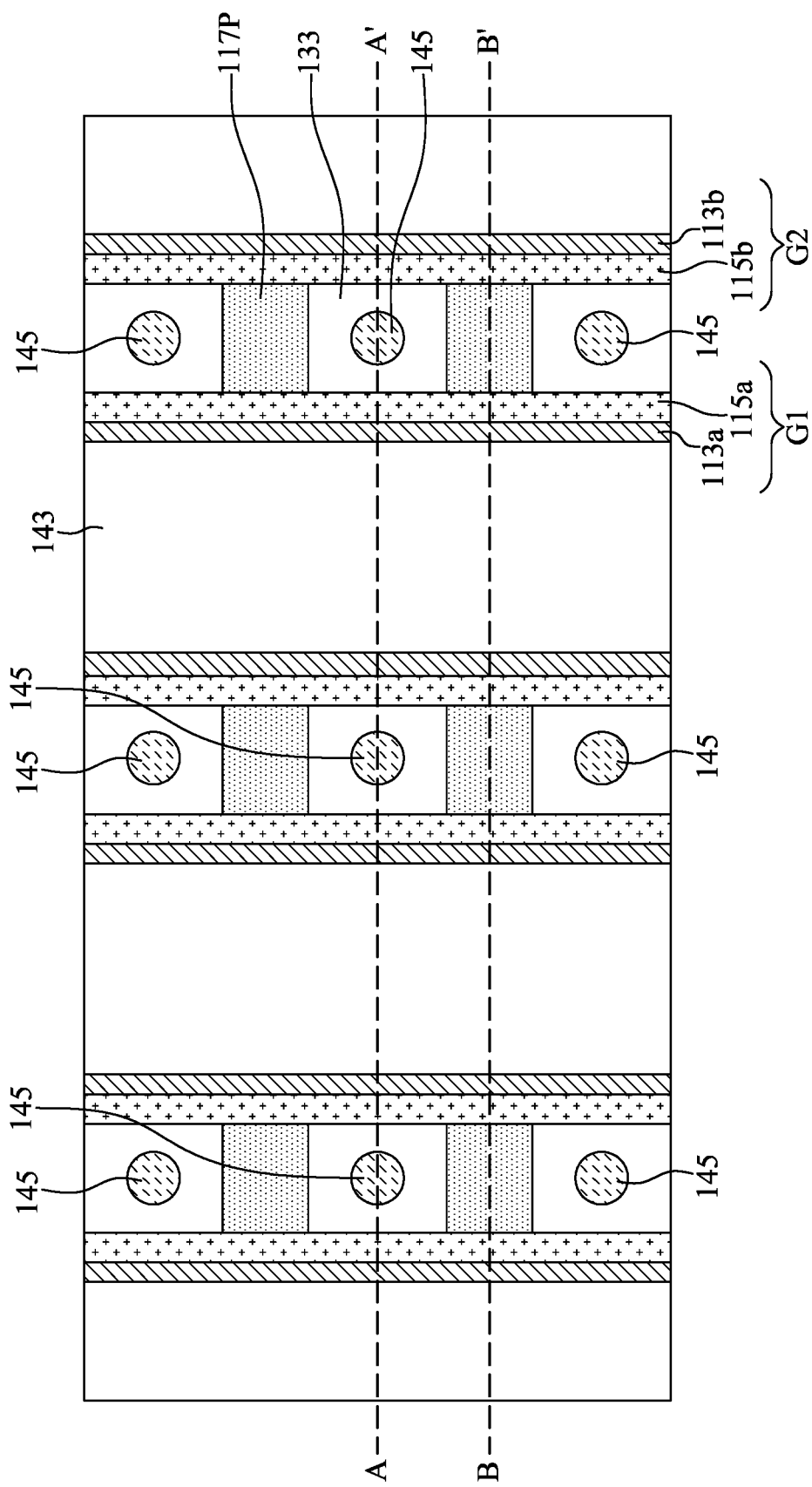
FIG. 28 is a top view illustrating an intermediate stage of forming bit line contacts over the channel structures during the formation of the memory device according to various embodiments of the present disclosure.
Figure 29:
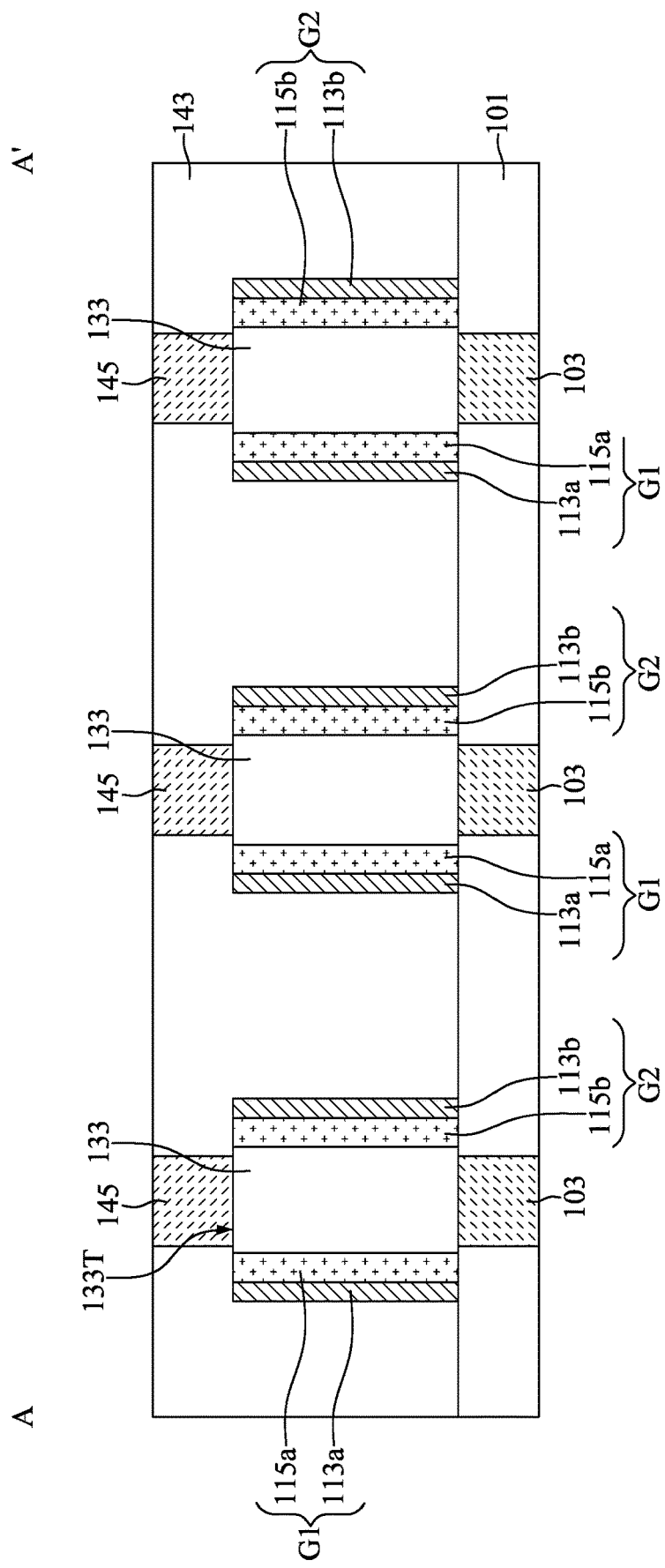
FIG. 29 is a cross-sectional view illustrating an intermediate stage in the formation of the memory device along the sectional line A-A' in FIG. 28 according to various embodiments of the present disclosure.
Figure 30:
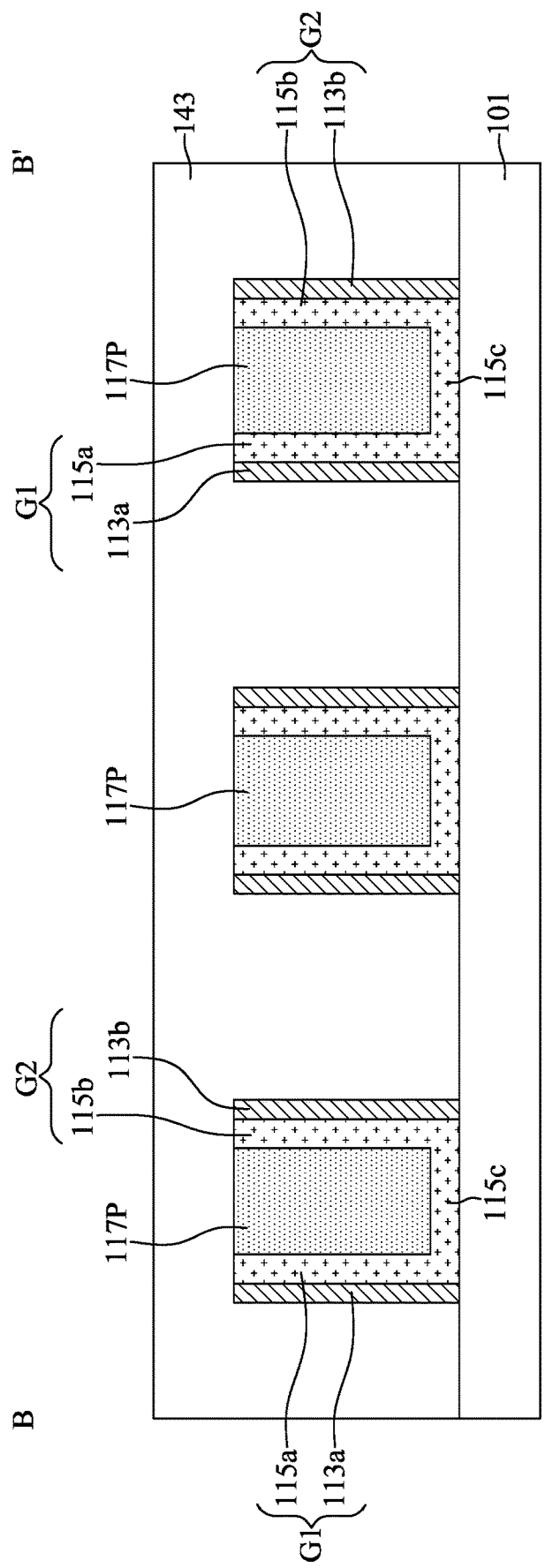
FIG. 30 is a cross-sectional view illustrating an intermediate stage in the formation of the memory device along the sectional line B-B' in FIG. 28 according to various embodiments of the present disclosure.

After the sacrificial structures 105 are removed, a dielectric layer 143 is formed over the semiconductor substrate 101 and covering the gate structures G1, G2 and the channel structures 133, and bit line contacts 145 are formed in the dielectric layer 143 and over the channel structures 133, as shown in FIGS. 28-30 in accordance with some embodiments. The respective step is illustrated as the step S21 in the method 10 shown in FIG. 5. Some materials and processes used to form the dielectric layer 143 are similar to, or the same as those used to form the dielectric layer 117, and details thereof are not repeated herein.

In addition, in some embodiments, the bit line contacts 145 are formed in direct contact with the top surface 133T of the channel structures 133. In some embodiments, the bit line contacts 145 are made of a conductive material, such as copper (Cu), tungsten (W), aluminum (Al), titanium (Ti), tantalum (Ta), gold (Au), silver (Ag). The method for forming the bit line contacts 145 may include forming a patterned mask (not shown) over the dielectric layer 143, etching the dielectric layer 143 to form bit line contact openings (not shown) using the patterned mask as a mask, depositing a conductive material in the bit line contact openings and over the dielectric layer 143, and planarizing the conductive material until the top surface of the dielectric layer 143 is exposed.

Then, a dielectric layer 151 is formed over the dielectric layer 143, and bit lines 153 are formed in the dielectric layer 143 and covering the bit line contacts 145, as shown in FIGS. 1-3 in accordance with some embodiments. The respective step is illustrated as the step S23 in the method 10 shown in FIG. 5. Some materials and processes used to form the dielectric layer 151 are similar to, or the same as those used to form the dielectric layer 117, and details thereof are not repeated herein.

In some embodiments, the bit lines 153 are electrically connected to the channel structures 133 through the bit line contacts 145. The bit lines 153 may be a single layer or multiple layers. For example, each of the bit lines 153 includes a lower bit line layer (not shown) and an upper bit line layer (not shown). In some embodiments, the lower bit line layer includes doped polysilicon, metal, metal silicide, or metal compound, and the upper bit line layers includes one or more metals or metal compounds. The bit lines 153 may be formed by a deposition process and a subsequent etching process. The deposition process may include CVD, ALD, PECVD, PEALD, another suitable method, or a combination thereof. The etching process may include a dry etching process, a wet etching process, or a combination thereof.

Moreover, a semiconductor substrate 201 including capacitors 209 is boned to the bottom surface 101B of the semiconductor substrate 101, such that each of the capacitors 209 is electrically connected to the corresponding capacitor contact 103, in accordance with some embodiments. The respective step is illustrated as the step S25 in the method 10 shown in FIG. 5. In some embodiments, the capacitors 209 are electrically connected to the channel structures 133 through the capacitor contacts 103.

In some embodiments, the capacitors 209 are metal-insulator-metal (MIM) capacitors. Specifically, each of the capacitors 209 includes two conductive layers 203 and 207 and a dielectric layer 205 sandwiched between the conductive layers 203 and 207. In some embodiments, the conductive layers 207 include titanium nitride (TiN), the dielectric layers 205 include a dielectric material, such as silicon dioxide ($SiO_2$), hafnium dioxide ($HfO_2$), aluminum oxide ($Al_2O_3$), zirconium dioxide ($ZrO_2$), or a combination thereof, and the conductive layers 203 include titanium nitride (TiN), low-stress silicon-germanium (SiGe), or a combination thereof.

The conductive layers 203, 207 and the dielectric layers 205 may be formed by deposition processes and planarization processes. The deposition process may include CVD, PVD, ALD, PECVD, PEALD, spin-on coating, another suitable method, or a combination thereof. The planarization process may include CMP. After the semiconductor substrate 201 including the capacitors 209 are bonded to the semiconductor substrate 101, the memory device 100a is obtained. In some embodiments, the memory device 100a is part of a DRAM.

In the memory device 100a, the channel structures 133 are vertically arranged between the capacitor contacts 103 and the bit line contacts 145 to electrically connect the capacitors 209 and the bit lines 153, which form vertical filed effect transistors (VFET) in the memory device 100a. By doing so, the surface area of the semiconductor substrate 101 occupied by the components of the memory device 100a can be reduced. Therefore, the integration density of the memory device 100a can be increased.

Figure 31:
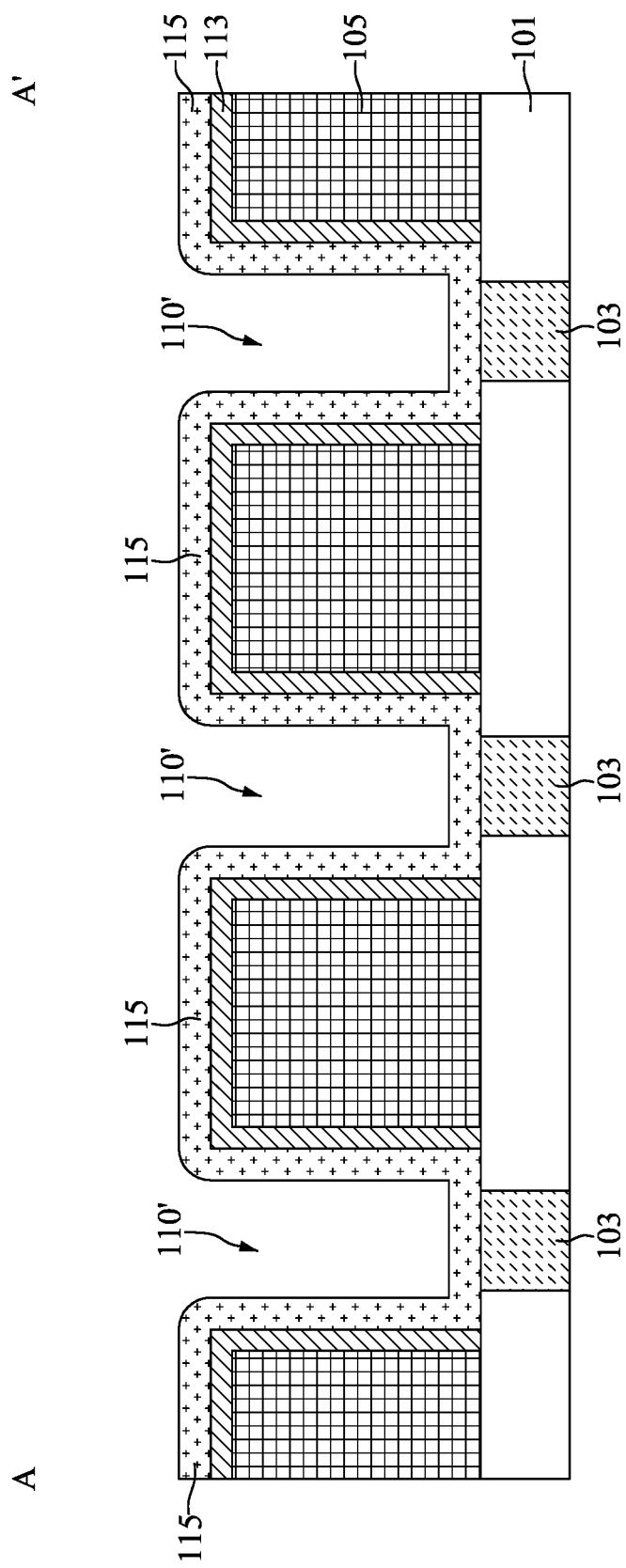
FIG. 31 is a cross-sectional view illustrating an intermediate stage of partially removing the gate dielectric layer following the step shown in FIG. 9 according to various embodiments of the present disclosure.

FIG. 31 is a cross-sectional view illustrating an intermediate stage of partially removing the gate dielectric layer 115 following the step shown in FIG. 9, in accordance with some alternative embodiments. In these cases, an etching process is performed on the gate dielectric layer 115 to extend (e.g., deepen) the openings 110. The etching process may be a wet etching process, a dry etching process, and a combination thereof. In some embodiments, the portions of the gate dielectric layer 115 covering the capacitor contacts 103 are removed.

After the etching process, the openings 110' exposing the capacitor contacts 103 are obtained. Then, the process flow for forming the memory device 100b may proceed as discussed with respect to FIG. 10. The following steps for forming the memory device 100b may be similar to, or the same as the steps for forming the memory device 100a. It should be noted that since the capacitor contacts 103 are exposed before the dielectric layer 117 is formed, there is no need to etch the gate dielectric layer 115 after the dielectric portions 117P are formed from etching the dielectric strips 117'. As a result, there is not any gate dielectric layer sandwiched between the dielectric portions 117P and the semiconductor substrate 101 in the memory device 100b with respect to FIG. 4, comparing with the connecting portions 115c of the memory device 100a shown in FIG. 3. In addition, the top view and the cross-sectional view taken along the sectional line A-A' of the memory device 100b are the same as those of the memory device 100a (i.e., FIGS. 1 and 2).

Embodiments of a memory device and method for preparing the same are provided in the disclosure. In some embodiments, the memory device (e.g., the memory devices 100a and 100b) includes a channel structure (e.g., the channel structure 133) disposed over a semiconductor substrate (e.g., the first semiconductor substrate 101) and covering a capacitor contact (e.g., the capacitor contact 103) in the semiconductor substrate, and a bit line contact (e.g., the bit line contact 145) disposed over the channel structure. In some embodiments, the memory device includes a first gate structure (e.g., the gate structure G1) disposed on a first sidewall (e.g., the sidewall SW1) of the channel structure, and a second gate structure (e.g., the gate structure G2) disposed on a second sidewall (e.g., the sidewall SW2) of the channel structure opposite to the first sidewall of the channel structure. The channel structure is electrically connected to a capacitor (e.g., the capacitor 209) and a bit line (e.g., the bit line 153) through the capacitor contact and the bit line contact. Since the channel structure provides a vertical electrical connection between the capacitor and the bit line, which forms a vertical filed effect transistor (VFET) in the memory device, the surface area of the semiconductor substrate occupied by the components in the memory device can be reduced. Therefore, the integration density of the memory device can be increased.

In one embodiment of the present disclosure, a memory device is provided. The memory device includes a capacitor contact disposed in a first semiconductor substrate, and a channel structure disposed over a top surface of the first semiconductor substrate. The memory device also includes a first gate structure disposed on a first sidewall of the channel structure, and a second gate structure disposed on a second sidewall of the channel structure. The second sidewall of the channel structure is opposite to the first sidewall of the channel structure. The memory device further includes a bit line contact disposed over the channel structure. The channel structure is electrically connected to a capacitor and a bit line through the capacitor contact and the bit line contact.

In another embodiment of the present disclosure, a memory device is provided. The memory device includes a first capacitor contact and a second capacitor contact disposed in a semiconductor substrate, and a first channel structure and a second channel structure disposed over the semiconductor substrate and separated from each other. The first channel structure is electrically connected to a first capacitor through the first capacitor contact, and the second channel structure is electrically connected to a second capacitor through the second capacitor contact. The memory device also includes a first gate structure disposed on a first sidewall of the first channel structure and a first sidewall of the second channel structure, and a second gate structure disposed on a second sidewall of the first channel structure and a second sidewall of the second channel structure. The first sidewall of the first channel structure is opposite to the second sidewall of the first channel structure, and the first sidewall of the second channel structure is opposite to the second sidewall of the second channel structure. The memory device further includes a first bit line contact and a second bit line contact disposed over the first channel structure and the second channel structure, respectively. The first channel structure is electrically connected to a first bit line through the first bit line contact, and the second channel structure is electrically connected to a second bit line through the second bit line contact.

In yet another embodiment of the present disclosure, a method for preparing a memory device is provided. The method includes forming a capacitor contact in a first semiconductor substrate, and forming a first sacrificial structure and a second sacrificial structure over a top surface of the first semiconductor substrate and on opposite sides of the capacitor contact. The method also includes forming a first gate structure on a sidewall of the first sacrificial structure and a second gate structure on a sidewall of the second sacrificial structure facing the sidewall of the first sacrificial structure, and forming a dielectric strip between the first gate structure and the second gate structure. The method further includes replacing a first portion of the dielectric strip with a channel structure, forming a bit line contact over the channel structure, and forming a bit line over the bit line contact.

The embodiments of the present disclosure have some advantageous features. By forming a vertical field effect transistor (VFET) in a memory device, such as forming a vertical electrical connection between a capacitor and a bit line, the surface area of the semiconductor substrate occupied by the components in the memory device can be reduced. As a result, the integration density of the memory device can be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:
 a capacitor contact disposed in a first semiconductor substrate;
 a channel structure disposed over a top surface of the first semiconductor substrate;
 a first gate structure disposed on a first sidewall of the channel structure;
 a second gate structure disposed on a second sidewall of the channel structure, wherein the second sidewall of the channel structure is opposite to the first sidewall of the channel structure;
 a bit line contact disposed over the channel structure, wherein the channel structure is electrically connected to a capacitor and a bit line through the capacitor contact and the bit line contact;
 a first dielectric portion disposed over the top surface of the first semiconductor substrate and on a third sidewall of the channel structure; and
 a second dielectric portion disposed over the top surface of the first semiconductor substrate and on a fourth sidewall of the channel structure, wherein the third sidewall of the channel structure is opposite to the fourth sidewall of the channel structure.

2. The memory device of claim 1, wherein the capacitor contact is in direct contact with a bottom surface of the channel structure, and the bit line contact is in direct contact with a top surface of the channel structure.

3. The memory device of claim 1, wherein the channel structure is disposed between the bit line and the capacitor.

4. The memory device of claim 1, further comprising:
 a second semiconductor substrate bonded to a bottom surface of the first semiconductor substrate, wherein the capacitor is disposed in the second semiconductor substrate.

5. The memory device of claim 1, wherein the first gate structure includes a first gate electrode and a first gate dielectric sandwiched between the first gate electrode and the channel structure, and wherein the second gate structure includes a second gate electrode and a second gate dielectric sandwiched between the second gate electrode and the channel structure.

6. The memory device of claim 1, wherein the first gate structure and the second gate structure extend to cover opposite sidewalls of each of the first dielectric portion and the second dielectric portion.

7. A memory device, comprising:
 a first capacitor contact and a second capacitor contact disposed in a semiconductor substrate;
 a first channel structure and a second channel structure disposed over the semiconductor substrate and separated from each other, wherein the first channel structure is electrically connected to a first capacitor through the first capacitor contact, and the second channel structure is electrically connected to a second capacitor through the second capacitor contact;
 a first gate structure disposed on a first sidewall of the first channel structure and a first sidewall of the second channel structure;
 a second gate structure disposed on a second sidewall of the first channel structure and a second sidewall of the second channel structure, wherein the first sidewall of the first channel structure is opposite to the second sidewall of the first channel structure, and the first sidewall of the second channel structure is opposite to the second sidewall of the second channel structure;
 a first bit line contact and a second bit line contact disposed over the first channel structure and the second channel structure, respectively, wherein the first channel structure is electrically connected to a first bit line through the first bit line contact, and the second channel structure is electrically connected to a second bit line through the second bit line contact;
 a first dielectric portion disposed between and in direct contact with the first channel structure and the second channel structure; and
 a second dielectric portion disposed between the first gate structure and the second gate structure, wherein the first channel structure is disposed between and in direct contact with the first dielectric portion and the second dielectric portion.

8. The memory device of claim 7, wherein the first capacitor contact is disposed between the first channel structure and the first capacitor, and the second capacitor contact is disposed between the second channel structure and the second capacitor.

9. The memory device of claim 7, wherein the first channel structure is in direct contact with the first capacitor contact and the first bit line contact, and the second channel structure is in direct contact with the second capacitor contact and the second bit line contact.

10. The memory device of claim 7, wherein the first dielectric portion is disposed between and in direct contact with the first gate structure and the second gate structure.

11. The memory device of claim 7, wherein the first dielectric portion is separated from the semiconductor substrate.

12. A method for preparing a memory device, comprising:
 forming a capacitor contact in a first semiconductor substrate;
 forming a first sacrificial structure and a second sacrificial structure over a top surface of the first semiconductor substrate and on opposite sides of the capacitor contact;
 forming a first gate structure on a sidewall of the first sacrificial structure and a second gate structure on a sidewall of the second sacrificial structure facing the sidewall of the first sacrificial structure;
 forming a dielectric strip between the first gate structure and the second gate structure;
 replacing a first portion of the dielectric strip with a channel structure;
 forming a bit line contact over the channel structure; and
 forming a bit line over the bit line contact.

13. The method for preparing a memory device of claim 12, further comprising:
 bonding a second semiconductor substrate to a bottom surface of the first semiconductor substrate, wherein a capacitor in the second semiconductor substrate is electrically connected to the channel structure through the capacitor contact.

14. The method for preparing a memory device of claim 12, further comprising:
   removing the first sacrificial structure and the second sacrificial structure after the channel structure is formed.

15. The method for preparing a memory device of claim 12, wherein a second portion of the dielectric strip adjoins the channel structure.

16. The method for preparing a memory device of claim 12, wherein forming the first gate structure and the second gate structure further comprises:
   forming a first gate electrode on the sidewall of the first sacrificial structure and a second gate electrode on the sidewall of the second sacrificial structure; and
   forming a first gate dielectric on a sidewall of the first gate electrode and a second gate dielectric on a sidewall of the second gate electrode, wherein the first gate dielectric and the second gate dielectric is physically connected by a connecting portion covering the capacitor contact.

17. The method for preparing a memory device of claim 16, wherein the connecting portion is partially etched to expose the capacitor contact before the channel structure is formed.

* * * * *